(12) United States Patent
Takahashi et al.

(10) Patent No.: US 8,324,079 B2
(45) Date of Patent: Dec. 4, 2012

(54) METHOD OF MANUFACTURING SEMICONDUCTOR DEVICE

(75) Inventors: Hidekazu Takahashi, Tochigi (JP); Daiki Yamada, Gunma (JP); Yohei Monma, Tochigi (JP); Hiroki Adachi, Tochigi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 652 days.

(21) Appl. No.: 12/355,069

(22) Filed: Jan. 16, 2009

(65) Prior Publication Data
US 2009/0183766 A1    Jul. 23, 2009

(30) Foreign Application Priority Data

Jan. 22, 2008    (JP) ................. 2008-011139

(51) Int. Cl.
*H01L 21/46* (2006.01)
(52) U.S. Cl. ................. 438/458; 257/E21.237
(58) Field of Classification Search .......... 438/458; 257/E21.237
See application file for complete search history.

(56) References Cited

U.S. PATENT DOCUMENTS

| | | | |
|---|---|---|---|
| 5,261,156 A | 11/1993 | Mase et al. | |
| 5,401,330 A | 3/1995 | Saito et al. | |
| 5,757,456 A | 5/1998 | Yamazaki et al. | |
| 5,834,327 A | 11/1998 | Yamazaki et al. | |
| 5,910,687 A | 6/1999 | Chen et al. | |
| 6,118,502 A | 9/2000 | Yamazaki et al. | |
| 6,221,751 B1 | 4/2001 | Chen et al. | |
| 6,362,866 B1 | 3/2002 | Yamazaki et al. | |
| 6,855,961 B2 | 2/2005 | Maruyama et al. | |
| 6,882,012 B2 | 4/2005 | Yamazaki et al. | |
| 6,900,873 B2 | 5/2005 | Yamazaki et al. | |
| 7,050,138 B1 | 5/2006 | Yamazaki et al. | |
| 7,067,395 B2 | 6/2006 | Maruyama et al. | |

(Continued)

FOREIGN PATENT DOCUMENTS

JP    02-090103    3/1990

(Continued)

OTHER PUBLICATIONS

International Search Report (Application No. PCT/JP2009/050911; PCT11211) Dated Feb. 24, 2009.

(Continued)

*Primary Examiner* — William D Coleman
(74) *Attorney, Agent, or Firm* — Eric J. Robinson; Robinson Intellectual Property Law Office, P.C.

(57) ABSTRACT

A semiconductor device in which the damage such as cracks, chinks, or dents caused by external stress is reduced is provided. In addition, the yield of a semiconductor device having a small thickness is increased. The semiconductor device includes a light-transmitting substrate having a stepped side surface, the width of which in a portion above the step and closer to one surface is smaller than that in a portion below the step, a semiconductor element layer provided over the other surface of the light-transmitting substrate, and a stack of a first light-transmitting resin layer and a second light-transmitting resin layer, which covers the one surface and part of the side surface of the light-transmitting substrate. One of the first light-transmitting resin layer and the second light-transmitting resin layer has a chromatic color.

7 Claims, 17 Drawing Sheets

U.S. PATENT DOCUMENTS

| | | | |
|---|---|---|---|
| 7,214,555 | B2 | 5/2007 | Yamazaki et al. |
| 7,271,858 | B2 | 9/2007 | Yamazaki et al. |
| 7,316,937 | B2 | 1/2008 | Kojima et al. |
| 7,352,044 | B2 | 4/2008 | Yamada et al. |
| 7,446,384 | B2 | 11/2008 | Paik et al. |
| 7,446,843 | B2 | 11/2008 | Yamazaki et al. |
| 7,642,113 | B2 | 1/2010 | Kurosawa |
| 7,833,881 | B2 | 11/2010 | Farnworth |
| 2003/0071953 | A1 | 4/2003 | Yamazaki et al. |
| 2003/0134453 | A1 | 7/2003 | Prabhu et al. |
| 2004/0076797 | A1 | 4/2004 | Zilber et al. |
| 2004/0113283 | A1 | 6/2004 | Farnworth et al. |
| 2004/0245530 | A1 | 12/2004 | Kameyama et al. |
| 2004/0266051 | A1 | 12/2004 | Kojima et al. |
| 2005/0009298 | A1 | 1/2005 | Suzuki et al. |
| 2005/0070038 | A1 | 3/2005 | Yamazaki et al. |
| 2005/0121672 | A1 | 6/2005 | Yamazaki et al. |
| 2005/0157242 | A1 | 7/2005 | Yamazaki et al. |
| 2006/0023108 | A1 | 2/2006 | Watanabe et al. |
| 2006/0044300 | A1 | 3/2006 | Koyama et al. |
| 2006/0065960 | A1 | 3/2006 | Maruyama et al. |
| 2006/0252246 | A1 | 11/2006 | Paik et al. |
| 2006/0270195 | A1 | 11/2006 | Yamada et al. |
| 2007/0026639 | A1 | 2/2007 | Noma et al. |
| 2007/0034995 | A1 | 2/2007 | Kameyama et al. |
| 2007/0115416 | A1 | 5/2007 | Yamazaki et al. |
| 2007/0190691 | A1 | 8/2007 | Humpston et al. |
| 2008/0179611 | A1* | 7/2008 | Chitnis et al. .................. 257/98 |
| 2008/0188022 | A1 | 8/2008 | Yamazaki et al. |
| 2009/0001256 | A1 | 1/2009 | Yanagisawa et al. |
| 2009/0002532 | A1 | 1/2009 | Nishida et al. |
| 2009/0004764 | A1 | 1/2009 | Ohnuma et al. |
| 2009/0166896 | A1 | 7/2009 | Yamazaki et al. |
| 2009/0174023 | A1 | 7/2009 | Takahashi et al. |
| 2009/0194154 | A1 | 8/2009 | Takahashi et al. |
| 2009/0267173 | A1 | 10/2009 | Takahashi et al. |

FOREIGN PATENT DOCUMENTS

| | | |
|---|---|---|
| JP | 03-278458 | 12/1991 |
| JP | 07-014880 | 1/1995 |
| JP | 07-084120 | 3/1995 |
| JP | 08-250745 | 9/1996 |
| JP | 08-264796 | 10/1996 |
| JP | 2001-064029 | 3/2001 |
| JP | 2003-255386 | 9/2003 |
| JP | 2006-041183 | 2/2006 |
| JP | 2006-191126 | 7/2006 |
| JP | 2006-295164 | 10/2006 |

OTHER PUBLICATIONS

Written Opinion (Application No. PCT/JP2009/050911; PCT11211) Dated Feb. 24, 2009.

US 7,359,010, 04/2008, Yamazaki et al. (withdrawn)

* cited by examiner

METHOD OF MANUFACTURING SEMICONDUCTOR DEVICE

TECHNICAL FIELD

The present invention relates to a semiconductor device and a method of manufacturing a semiconductor device. In particular, the present invention relates to a semiconductor device including a photoelectric conversion element.

BACKGROUND ART

Some of sensors, which have sensitivity in a visible light region having a wavelength of 400 nm to 700 nm, are referred to as optical sensors or visible light sensors. Optical sensors or visible light sensors are known to be used for, for example, detecting optical signals to read data, detecting the ambient brightness to control operation of electronic devices, and the like.

For example, in cellular phones or television devices, optical sensors are used for controlling the luminance of display screens in accordance with the ambient brightness of places where they are set.

Such semiconductor devices as optical sensors and visible light sensors are obtained by forming transistors over a glass substrate or a wafer and then cutting (dividing) the substrate.

A substrate is generally divided as follows: first, a groove (also referred to as a scribe line) is formed on the surface of the substrate by using a scribing device; then, the substrate is forcibly divided along the groove by using a cutting device. In the case of using a laser beam, first, a substrate is selectively irradiated with a laser beam to be locally heated. Next, the surface of the heated substrate is locally cooled by a cooling medium. Then, a crack is formed by utilizing thermal stress generated in the substrate, whereby the substrate is divided (for example, see Reference 1: Japanese Published Patent Application No. 2001-64029).

DISCLOSURE OF INVENTION

However, a semiconductor device might be damaged by external stress such as pressure, which is applied in the manufacturing process or inspection process of the semiconductor device. Damage such as cracks, chinks, or dents occurs more frequently as a substrate becomes thinner and weaker.

In addition, a dicer or the like is often used as a scribing device. A blade of such a dicer (a dicing blade) is worn out after several uses, and thus needs to be replaced. Since a dicing blade is expensive, it has been difficult to reduce production cost.

In view of the foregoing problems, it is an object of the present invention to reduce the damage of a semiconductor device such as cracks, chinks, or dents caused by external stress. It is another object of the present invention to reduce the thickness of a substrate over which a semiconductor device is provided. It is still another object of the present invention to increase the yield of a semiconductor device having a small thickness. It is a still further object of the present invention to reduce the production cost of a semiconductor device having a small thickness.

By dividing a large-sized substrate for each semiconductor element layer, a plurality of semiconductor devices are obtained in the form of a chip. In a dividing method, first, a substrate is processed to be thin so as to shorten the time required for division and reduce the wear of a processing means such as a dicer that is used for division. The dividing step is not performed at a time: first, a groove for dividing a semiconductor element layer is formed on the substrate; light-transmitting resin layers are stacked over the light-transmitting substrate including the groove; then, the resin layers and the light-transmitting substrate are cut along the groove, thereby being divided (separated) into a plurality of semiconductor devices. One of the light-transmitting resin layers is a chromatic coloring layer functioning as a color filter, and the other is a resin layer functioning as an impact absorption layer.

Chromatic colors are colors except achromatic colors such as black, gray, and white. In order to function as a color filter, the coloring layer is formed of a material that transmits only the chromatic color light. As the chromatic color, red, green, blue, or the like can be used. Besides, cyan, magenta, yellow, or the like may be used. "Transmitting only the chromatic color light" means that light transmitted through the coloring layer has a peak at the wavelength of the chromatic color light.

Accordingly, one mode of a semiconductor device disclosed in this specification includes: a light-transmitting substrate; a stack of a first light-transmitting resin layer and a second light-transmitting resin layer, which covers one surface and a part of the side surface of the light-transmitting substrate; a semiconductor element layer provided over the other surface of the light-transmitting substrate, which is opposite to the one surface; and wherein a side surface of the light-transmitting substrate is curved so that a width of an upper portion of the light-transmitting substrate is smaller than a width of a lower portion of the light-transmitting substrate, and wherein one of the first light-transmitting resin layer and the second light-transmitting resin layer has a chromatic color. The cross-sectional shape of the light-transmitting substrate may be considered as a projection or an upside-down T-shaped block. The portion above the step is the upward portion of the light-transmitting substrate in the case where the semiconductor element layer is formed on the downward surface of the light-transmitting substrate.

When the cross section of the light-transmitting substrate has an upside-down T-shape, the light-transmitting resin layers can be provided so as to fill in cutouts on the edges of the light-transmitting substrate.

Another mode of the semiconductor device disclosed in this specification includes: a light-transmitting substrate including a cross section that is a stepped trapezoid; a stack of a first light-transmitting resin layer and a second light-transmitting resin layer, which covers one surface and a part of the side surface of the light-transmitting substrate; a semiconductor element layer provided over the other surface of the light-transmitting substrate, which is opposite to the one surface; and wherein a width of a top surface of the trapezoid is smaller than a width of a lower surface of the trapezoid, and wherein one of the first light-transmitting resin layer and the second light-transmitting resin layer has a chromatic color. Depending on the shape of a groove, the trapezoid is curved from the upper portion to the lower portion.

When the light-transmitting substrate has a trapezoid cross section that is curved from the upper portion to the lower portion, the coverage of the light-transmitting resin layers in the curved portion is improved.

When one of the light-transmitting resin layers that is in contact with the light-transmitting substrate functions as a chromatic coloring layer while the other light-transmitting resin layer functioning as an impact absorption layer is formed on the coloring layer, deterioration of the coloring layer can be prevented. The thickness of the light-transmitting resin layer functioning as an impact absorption layer may be larger than that of the light-transmitting resin layer functioning as a coloring layer. With a larger thickness of the light-transmitting resin layer functioning as an impact absorption layer, impact resistance can be further improved. On the other hand, the thickness of the light-transmitting resin layer of a chromatic color, which functions as a coloring layer (a color filter), may be controlled as appropriate in accordance with the relationship between the concentration and the light transmittance of a color material to be contained.

In one mode of the semiconductor device having the aforementioned structure, a side surface of the light-transmitting substrate, which is in contact with the light-transmitting resin layer, is curved and enlarged toward the bottom. Since the side surface of the light-transmitting substrate is curved and enlarged toward the bottom, the light-transmitting resin layer can be provided to cover the curved side surface. The bottom surface and the top surface of the light-transmitting substrate are quadrangular, and the area of the bottom surface is larger than that of the top surface. In the semiconductor device of this specification, a surface of the light-transmitting substrate, which is in contact with the light-transmitting resin layer, is referred to as a top surface, and the other surface on which a semiconductor element layer is provided is referred to as a bottom surface. When the bottom surface of the light-transmitting substrate has a larger area than the top surface thereof, the light-transmitting resin layers can be provided on the side surface of a region where the bottom surface and the top surface do not overlap each other, so as to surround the light-transmitting substrate.

As set forth above, the semiconductor device disclosed in this specification has a complicated shape; thus, up, down, right, and left of the semiconductor device can be easily determined, leading to reduction in errors even in automatic machine operation.

The semiconductor element layer may include a photoelectric conversion element and an amplifier circuit for amplifying the output of the photoelectric conversion element. The photoelectric conversion element may have a structure in which a p-type semiconductor layer, an i-type semiconductor layer, and an n-type semiconductor layer are stacked.

In this specification, the i-type semiconductor is a semiconductor that contains an impurity imparting p-type or n-type conductivity at a concentration of $1\times10^{20}$ $cm^{-3}$ or less, includes oxygen and nitrogen at a concentration of $1\times10^{20}$ $cm^{-3}$ or less, and has a photoconductivity 100 times or more as high as dark conductivity. This i-type semiconductor may contain an impurity element belonging to Group 13 or 15 of the periodic table. That is, the i-type semiconductor has a weak n-type conductivity when an impurity element for controlling valence electrons is not intentionally added thereto; therefore, an impurity element imparting p-type conductivity may be added to an i-type semiconductor layer intentionally or unintentionally at the same time as or after the deposition.

In one mode of a method of manufacturing a semiconductor device disclosed in this specification, a plurality of semiconductor layers are formed over a light-transmitting substrate. The thickness of the light-transmitting substrate is reduced. A groove is formed between the adjacent semiconductor element layers formed over the light-transmitting substrate. A first light-transmitting resin layer is formed over the light-transmitting substrate including the groove, and a second light-transmitting resin layer is formed over the first light-transmitting resin layer. The groove of the light-transmitting substrate, the first resin layer, and the second resin layer are cut. One of the first light-transmitting resin layer and the second light-transmitting resin layer includes a chromatic color material.

The light-transmitting substrate including the groove, and the light-transmitting resin layers can be cut from the side of the light-transmitting substrate or the side of the light-transmitting resin layers. In the case where an alignment marker is formed on the light-transmitting substrate, the cutting is preferably made from the side of the light-transmitting substrate by a cutting means such as a dicer, so that the cutting portion is determined precisely.

In the step of forming the groove and the step of dividing the light-transmitting substrate, a dicer, a scriber, or the like can be used as a cutting tool, and a dicer is preferably used. A dicing blade is used in the steps of forming the groove and dividing the light-transmitting substrate and the semiconductor element layers by using a dicer. The dicing blade used in the step of forming the groove is thicker than that used in the step of dividing the light-transmitting substrate and the semiconductor element layers. That is, a cutting notch formed in the step of forming the groove is made larger than that formed in the step of dividing the light-transmitting substrate and the semiconductor element layers. The cutting notch means here the width of a groove in the case of forming the groove, or the width (also referred to as the width of the cutting surface) of a region where part of a light-transmitting substrate between elements disappears when the position of the light-transmitting substrate is fixed before and after the cutting.

In the step of polishing the light-transmitting substrate to reduce the thickness thereof, a glass polisher, a glass grinder, or the like can be used in appropriate combination. This polishing step can reduce the wear of the dicing blade. In addition, cracks occurring in a desired element in the step of handling and dividing the light-transmitting substrate having a small thickness can be reduced by providing the resin layers. Furthermore, even in the case where semiconductor devices that are divided in the form of a chip collide with each other when being handled, dents or cracks can be reduced, leading to increase in yield at the visual inspection of the semiconductor devices. Still further, since the light-transmitting substrate after being divided has a small thickness, the size of a device on which the semiconductor device is mounted can be reduced.

The width of a cutting notch formed in the step of forming the groove is larger than that formed in the dividing step. Therefore, when the light-transmitting substrate is divided in the dividing step, the resin layers can remain on the edges of the light-transmitting substrate. That is, the resin layers are formed in regions of the side surfaces of the light-transmitting substrate in which the groove is formed. On the other hand, a surface of the light-transmitting substrate, over which the semiconductor element layer is formed, and a region of the light-transmitting substrate, which is brought into contact with a dicing blade in the case of using the dicing blade in the dividing step, are not covered with the resin layers.

A surface of the light-transmitting substrate opposite to the surface over which the semiconductor element layer is formed, and part of the edges of the light-transmitting substrate are covered with the resin. Accordingly, occurrence of dents or cracks can be reduced, leading to increase in yield of the semiconductor device.

Thus, it is possible to provide a semiconductor device that is easy to be handled and has high reliability even if it has a small thickness.

In addition, the thickness of the light-transmitting substrate is reduced before the light-transmitting substrate is divided, and the dividing step is performed in two steps; therefore, it is possible to reduce the wear of a cutting tool in the process of dividing the light-transmitting substrate. The processing region of a cutting tool is increased with an increase in size of a light-transmitting substrate and a decrease in size of a semiconductor device to be divided, which causes a further increase in wear of the cutting tool. Accordingly, the invention disclosed in this specification, which can reduce the wear of a cutting tool, is particularly effective for a large substrate and a smaller semiconductor device. A semiconductor device can thus be manufactured at a lower cost. Since a light-transmitting substrate has a small thickness, the size of a semiconductor device can be reduced.

BEST MODE FOR CARRYING OUT THE INVENTION

Figure 1A:
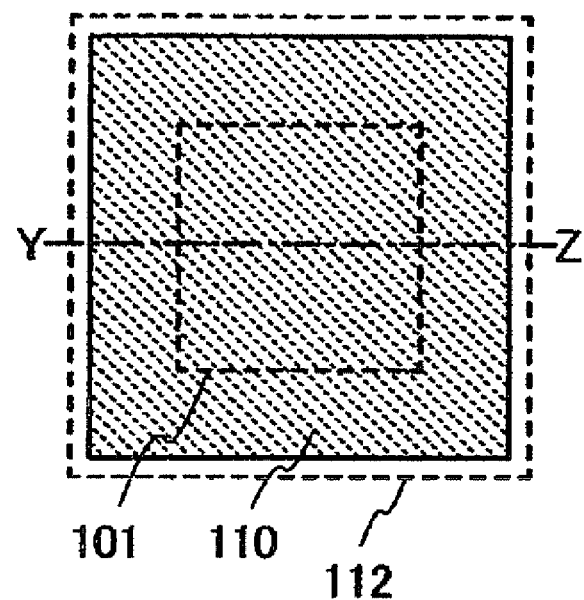
FIGS. 1A and 1B are diagrams illustrating a semiconductor device of the present invention.

Embodiment modes will be described in detail with reference to the drawings. Note that the present invention is not limited to the description given below, and modes and details can be modified in various ways without departing from the spirit and scope of the present invention. Accordingly, the present invention should not be construed as being limited to the description of the embodiment modes given below. Note that in the structures disclosed in this specification below, the identical portions or portions having a similar function are denoted by the identical reference numerals in different drawings, and description thereof is omitted.

Embodiment Mode 1

In this embodiment mode, a semiconductor device that is intended to be reduced in thickness and size, and a method of manufacturing the semiconductor device at a high yield will be described in detail with reference to FIGS. 1A and 1B, FIGS. 2A to 2F, FIGS. 3A to 3D, FIGS. 4A to 4C, FIGS. 5A and 5B, and FIGS. 6A and 6B.

Figure 1B:
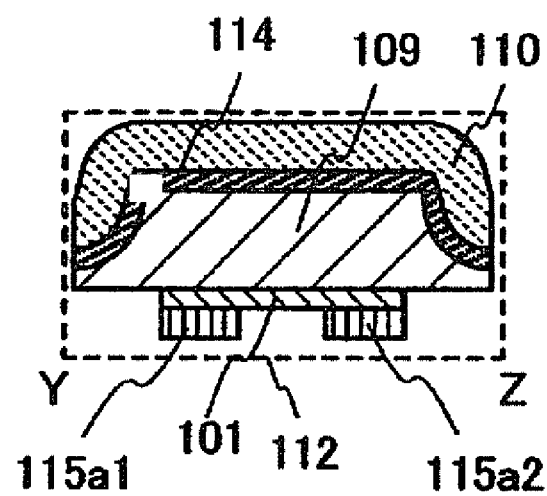

FIGS. 1A and 1B illustrate a semiconductor device of this embodiment mode. FIG. 1A is a plan view of the semiconductor device and FIG. 1B is a cross-sectional view taken along line Y-Z of FIG. 1A.

A semiconductor device 112 in FIGS. 1A and 1B includes a semiconductor element layer 101 formed on a light-transmitting substrate 109. A surface of the light-transmitting substrate 109 opposite to the surface on which the semiconductor element layer 101 is formed, and part of side surfaces of the light-transmitting substrate 109 are covered with a stack of a light-transmitting resin layer 114 and a light-transmitting resin layer 110. One of the stacked light-transmitting resin layers is a chromatic coloring layer functioning as a color filter, and the other is a resin layer functioning as an impact absorption layer. In this embodiment mode, the light-transmitting resin layer 114 is a chromatic coloring layer. The semiconductor element layer 101 is provided with terminal electrodes 115a and 115b that are conductive layers for electrical connection to the outside. In this specification, the light-transmitting resin layer in contact with the light-transmitting substrate is also referred to as a first light-transmitting resin layer, and the light-transmitting resin layer stacked on the first light-transmitting resin layer is also referred to as a second light-transmitting resin layer.

The side surfaces of the light-transmitting substrate 109 have a step, and the width of the light-transmitting substrate 109 in a portion above the step is smaller than that in a portion below the step. Accordingly, the cross section of the light-transmitting substrate 109 may also be considered as an upside-down T-shape. The portion above the step is the upward portion of the light-transmitting substrate 109 in the case where the semiconductor element layer 101 is formed on the downward surface of the light-transmitting substrate 109.

When the light-transmitting resin layer 114 in contact with the light-transmitting substrate 109 is a chromatic coloring layer and the light-transmitting resin layer 110 functioning as an impact absorption layer is formed on the coloring layer, deterioration of the coloring layer can be prevented. The total thickness of the stacked light-transmitting resin layers may be 1 μm to 20 μm. The thickness of the light-transmitting resin layer 110 functioning as an impact absorption layer and the thickness of the light-transmitting resin layer 114 functioning as a coloring layer may be substantially the same (for example, 1.2 μm thick) or different from each other.

For example, the thickness of the light-transmitting resin layer 110 functioning as an impact absorption layer may be larger than that of the light-transmitting resin layer 114 functioning as a coloring layer. In that case, for example, the thickness of the light-transmitting resin layer 110 functioning as an impact absorption layer may be 5 μm to 10 μm, and the thickness of the light-transmitting resin layer 114 functioning as a coloring layer may be 0.1 μm to 1 μm.

In this embodiment mode, the semiconductor element layer has a photoelectric conversion element and can be used as a color sensor when a coloring layer is provided. Since the side surfaces of the light-transmitting substrate are partially covered with the light-transmitting resin layer functioning as a coloring layer, light having a wavelength that is selected by the coloring layer can enter the photoelectric conversion element through the side surfaces of the light-transmitting substrate. Accordingly, it is possible to reduce external light that causes malfunction of the photoelectric conversion element.

In the semiconductor device of this embodiment mode, the side surfaces of the light-transmitting substrate, which are in contact with the light-transmitting resin layer, are curved and enlarged toward the bottom. The bottom surface and the top surface of the light-transmitting substrate are quadrangular, and the area of the bottom surface is larger than that of the top surface.

By dividing the large-sized light-transmitting substrate for each semiconductor element layer, a plurality of semiconductor devices are obtained in the form of a chip. In a dividing method, first, the substrate is processed to be thin so as to shorten the time required for division and reduce the wear of a processing means such as a dicer that is used for division. The dividing step is not performed at a time: first, a groove for dividing the semiconductor element layer is formed on the light-transmitting substrate; the light-transmitting resin layers are stacked over the light-transmitting substrate including the groove; then, the light-transmitting resin layers and the light-transmitting substrate are cut along the groove, thereby being divided (separated) into a plurality of semiconductor devices.

The cross section of the light-transmitting substrate 109 is a trapezoid with a stepped side surface, and the thickness of the upper portion of the stepped trapezoid is larger than that of the lower portion. Depending on the shape of the groove, the trapezoid is curved from the upper portion to the lower portion as illustrated in FIG. 1B.

Chromatic colors are colors except achromatic colors such as black, gray, and white. In order to function as a color filter, the coloring layer is formed of a material that transmits only the chromatic color light. As the chromatic color, red, green, blue, or the like can be used. Besides, cyan, magenta, yellow, or the like may be used.

Figure 17:
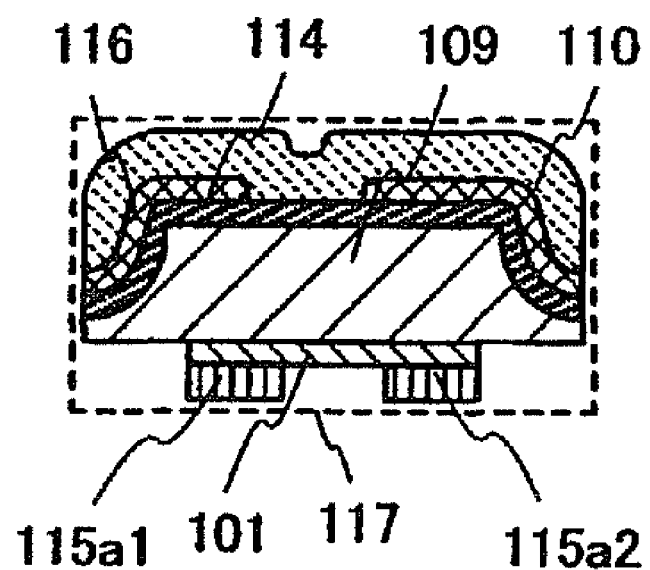
FIG. 17 is a diagram illustrating a semiconductor device of the present invention.

Furthermore, a black matrix may be provided. FIG. 17 illustrates a semiconductor device including a light-shielding layer that functions as a black matrix. A semiconductor device 117 in FIG. 17 includes a light-shielding layer 116 that is selectively formed over the chromatic light-transmitting resin layer 114 functioning as a color filter. The light-shielding layer 116 can be formed by a coating method such as spin coating, or alternatively can be formed by droplet discharging, printing, dipping, dispensing, brush coating, spraying, flow coating, or the like. The light-shielding layer can be selectively formed by printing, which leads to simplification of the step of processing the light-shielding layer into a desired shape by a photolithography step.

The light-shielding layer 116 is formed to have an opening at a position corresponding to a region where the photoelectric conversion element of the semiconductor element layer 101 is provided. The light-shielding layer 116 functions as a black matrix, and prevents undesired external light from entering the photoelectric conversion element, which may cause malfunction. Thus, the photoelectric conversion element can receive only light that enters from the opening of the light-shielding layer 116 and is transmitted through the chromatic light-transmitting resin layer 114 functioning as a color filter, leading to improvement in reliability of the semiconductor device. In addition, when a semiconductor element formed on the semiconductor element layer is irradiated with light, the characteristics of the semiconductor element may vary; however, such a defect can be prevented by providing the light-shielding layer.

A method of manufacturing a semiconductor device in this embodiment mode will be described below in detail.

Figure 2A:
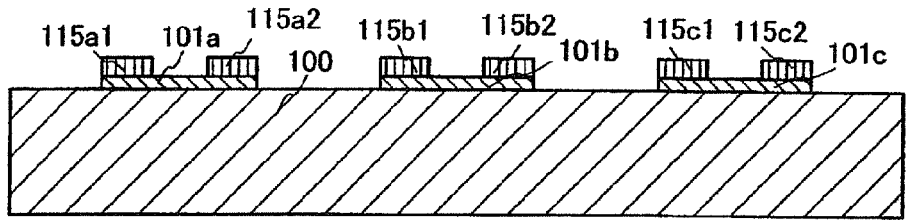
FIGS. 2A to 2F are diagrams illustrating a method of manufacturing a semiconductor device of the present invention.
Figure 2B:
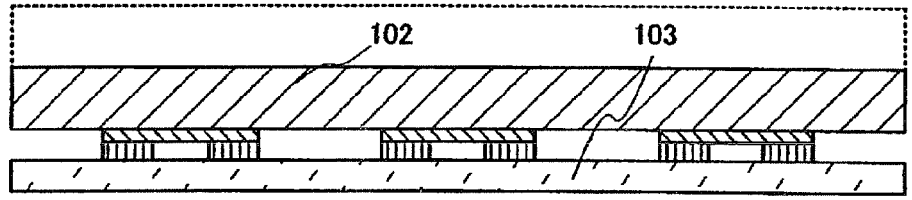
Figure 2C:
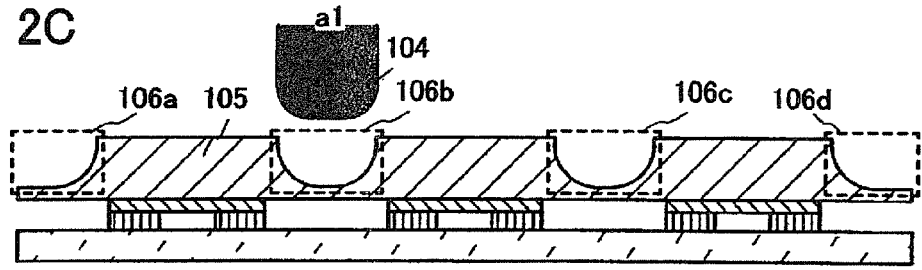

FIG. 2A illustrates semiconductor element layers 101a, 101b, and 101c each having a photoelectric conversion element, which are provided over a light-transmitting substrate 100. The semiconductor element layers 111a, 101b, and 101c include terminal electrodes 115a1 and 115a2, terminal electrodes 115b1 and 115b2, and terminal electrodes 115c1 and 115c2, respectively.

Next, the thickness of the light-transmitting substrate 100 is reduced by grinding and polishing treatment. A fastening tape 103 for fixing the light-transmitting substrate 100 during the step is attached to the light-transmitting substrate 100 so that the semiconductor element layers 101a, 101b, and 101c face the fastening tape 103. Then, the light-transmitting substrate 100 is processed to be a light-transmitting substrate 102 having a smaller thickness (see FIG. 2B). If the light-transmitting substrate 100 is a glass substrate with a thickness of 0.5 mm, the thickness of the light-transmitting substrate 102 is preferably reduced to about 0.25 mm to 0.3 mm, which is half the thickness of the light-transmitting substrate 100. By reducing the thickness of the light-transmitting substrate, the time required for dividing the light-transmitting substrate can be shortened and the wear of a processing means such as a dicer used for division can be reduced. The grinding treatment and the polishing treatment can be used in appropriate combination. In this embodiment mode, the light-transmitting substrate is ground by a grinder, and then polished by a polisher so that the surface thereof is planarized. As the polishing treatment, chemical mechanical polishing may be performed.

By dividing the light-transmitting substrate, a plurality of semiconductor devices are obtained in the form of a chip. The dividing step is not performed at a time: first, grooves 106a, 106b, 106c, and 106d used for dividing the semiconductor element layers 101a, 101b, and 101c are formed on the light-transmitting substrate 102 by a dicing blade of a dicer 104 (see FIG. 2C). A light-transmitting substrate 105 is purposely left in the grooves 106a, 106b, 106c, and 106d. The thickness of the left light-transmitting substrate 105 may be about 30 μm to 100 μm (preferably, 30 μm to 50 μm).

Figure 2D:
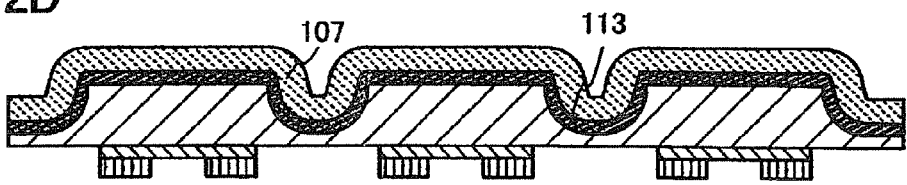
Figure 2E:
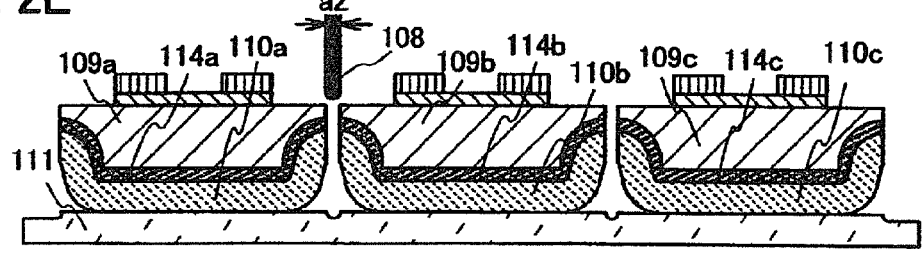

Next, a light-transmitting resin layer 113 and a light-transmitting resin layer 107 are stacked over the light-transmitting substrate 105 including the grooves 106a, 106b, 106c, and 106d (see FIG. 2D). In the case where heat treatment is performed after the light-transmitting resin layers are formed (for example, when the semiconductor device is mounted), the light-transmitting resin layers 113 and 107 are formed of a resin material capable of withstanding the heating temperature. One of the stacked light-transmitting resin layers is a chromatic coloring layer functioning as a color filter, and the other is a resin a layer functioning as an impact absorption layer. In this embodiment mode, the light-transmitting resin layer 113 is formed of a chromatic color material so as to function as a coloring layer.

By forming the light-transmitting resin layer 107 functioning as an impact absorption layer, the semiconductor device can have a higher tolerance to stress. For example, the semiconductor device provided with the light-transmitting resin layer disclosed in this specification can withstand a pressure of about 20 N without being damaged.

For the light-transmitting resin layers, the following resin materials can be used: a vinyl resin, an epoxy resin, a phenol resin, a novolac resin, an acrylic resin, a melamine resin, a urethane resin, a siloxane resin, and the like. The resin layers can be formed by a coating method such as spin coating, or alternatively can be formed by droplet discharging, printing, dipping, dispensing, brush coating, spraying, flow coating, or the like.

Subsequently, the light-transmitting resin layers 113 and 107 and the light-transmitting substrate 105 are cut along the grooves 106a, 106b, 106c, and 106d, thereby being divided (separated) into a plurality of semiconductor devices. In this embodiment mode, a fastening tape 111 is attached to the light-transmitting substrate 105 and the light-transmitting resin layers 113 and 107, and the light-transmitting substrate 105 that is left in the grooves 106a, 106b, 106c, and 106d, and the light-transmitting resin layers 113 and 107 are cut by a dicer 108 from the side of the light-transmitting substrate 105. The light-transmitting substrate 105 and the light-transmitting resin layers 113 and 107 are separated by the dicer 108 into light-transmitting substrates 109a, 109b, and 109c, light-transmitting resin layers 114a, 114b, and 114c, and light-transmitting resin layers 110a, 110b, and 110c, respectively (see FIG. 2E). In this embodiment mode, a dicing tape is used as the fastening tapes 103 and 111.

The light-transmitting substrate 105 including the grooves, and the light-transmitting resin layers 113 and 107 can be cut from the side of the light-transmitting substrate 105 or the side of the light-transmitting resin layers 113 and 107. In the case where an alignment marker is formed on the light-transmitting substrate 105, the cutting is preferably made from the side of the light-transmitting substrate 105 by a cutting means such as a dicer, so that the cutting portion can be determined precisely.

Figure 2F:
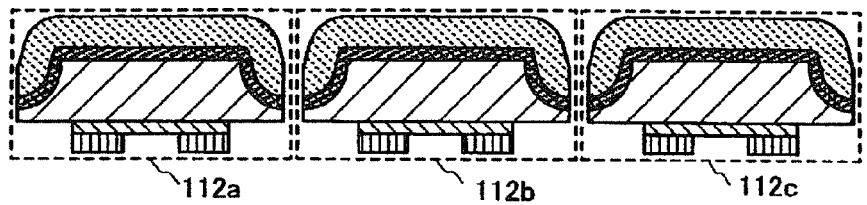

Through the aforementioned steps, semiconductor devices 112a, 112b, and 112c can be obtained (see FIG. 2F). The width of the cutting surface of the light-transmitting resin layers 113 and 107 and the light-transmitting substrate 105 is made smaller than that of the grooves, whereby the resin layers formed in the grooves can be left on the side surfaces of the light-transmitting substrate. In this embodiment mode, the width of the dicer 104 and the dicer 108 is the thickness of a dicing blade that determines a processing region (a region processed by a dicer).

The width of the grooves can be controlled by the width a1 of a dicing blade, while the width of the cutting surface can be controlled by the width a2 of a dicing blade of the dicer 108; therefore, the width a2 of the dicing blade of the dicer 108 is made smaller than the width a1 of the dicing blade of the dicer 104. In this embodiment mode, for example, the width a1 of the dicing blade of the dicer 104 is set to 0.16 mm, while the width a2 of the dicing blade of the dicer 108 is set to 0.1 mm.

Accordingly, in the semiconductor devices 112a, 112b, and 112c, the surfaces of the substrates over which the semiconductor element layers 101a, 101b, and 101c are not formed, and part of the side surfaces are covered with the resin layers 110a, 110b, and 110c, respectively.

The shape of the grooves formed on the light-transmitting substrate depends on the processing means. In this embodiment mode, the grooves 106a, 106b, 106c, and 106d reflect the slightly rounded shape of the dicing blade of the dicer 104, thereby having a rounded shape (having a curvature) in the cross-sectional views of FIG. 2C. If the dicing blade has a rectangular shape, the grooves also have a rectangular shape and the edges of the light-transmitting substrate of the semiconductor device after being divided can also have a rectangular shape.

Figure 9A:
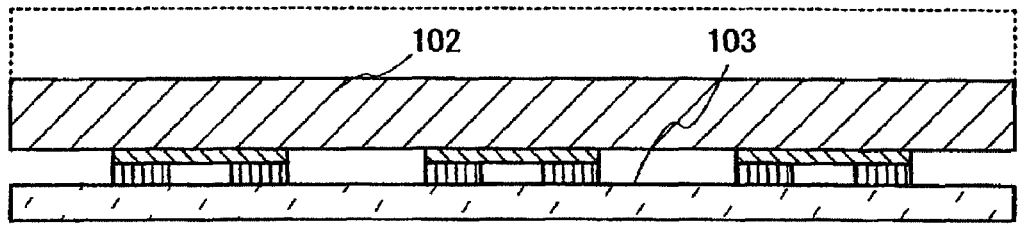
FIGS. 9A to 9E are diagrams illustrating a method of manufacturing a semiconductor device of the present invention.

FIGS. 9A to 9E illustrate an example of using a rectangular dicing blade as the processing means. FIG. 9A corresponds to FIG. 2B, where the light-transmitting substrate 102 on which the semiconductor element layers 101a, 101b, and 101c are formed is ground and polished over the fastening tape 103.

Figure 9B:
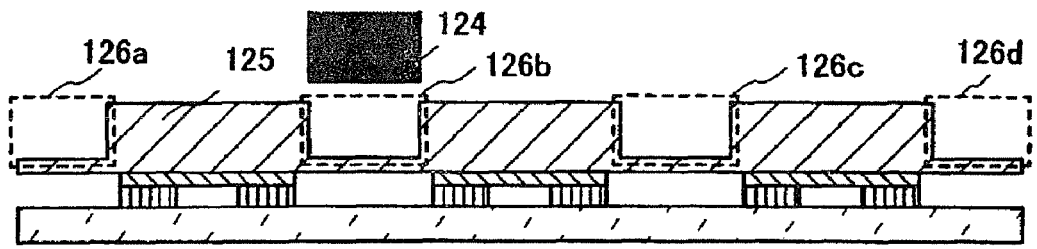

Grooves 126a, 126b, 126c, and 126d for dividing the semiconductor element layers 101a, 101b, and 101c are formed on the light-transmitting substrate 102 by a dicer 124 (see FIG. 9B). Since the dicer 124 uses a rectangular dicing blade, the grooves 126a, 126b, 126c, and 126d of the light-transmitting substrate 125 have a rectangular shape in the cross-sectional view.

Figure 9C:
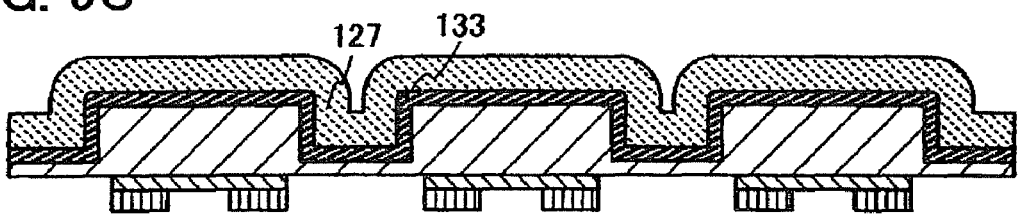
Figure 9D:
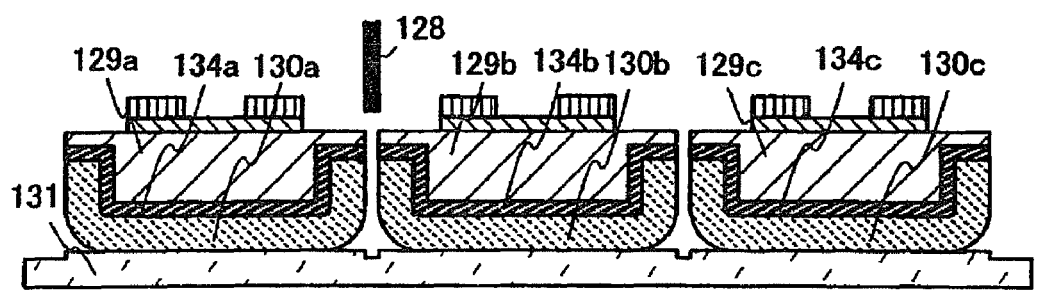

Next, light-transmitting resin layers 133 and 127 are formed over the light-transmitting substrate 125 including the grooves 126a, 126b, 126c, and 126d (see FIG. 9C).

After that, the light-transmitting resin layers 133 and 127 and the light-transmitting substrate 125 are cut along the grooves 126a, 126b, 126c, and 126d, thereby being divided (separated) into a plurality of semiconductor devices. In this embodiment mode, a fastening tape 131 is attached to the light-transmitting substrate 125 and the light-transmitting resin layers 133 and 127, and the light-transmitting substrate 125 that is left in the grooves 126a, 126b, 126c, and 126d, and the light-transmitting resin layers 133 and 127 are cut by a dicer 128 from the side of the light-transmitting substrate 125. The light-transmitting substrate 125 and the light-transmitting resin layers 133 and 127 are separated by the dicer 128 into light-transmitting substrates 129a, 129b, and 129c, light-transmitting resin layers 134a, 134b, and 134c, and light-transmitting resin layers 130a, 130b, and 130c, respectively (see FIG. 9D).

Figure 9E:
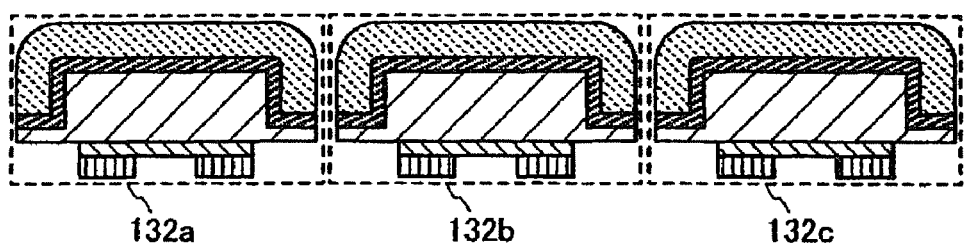

Through the aforementioned steps, semiconductor devices 132a, 132b, and 132c can be obtained (see FIG. 9E). The semiconductor devices 132a, 132b, and 132c reflect the shape of the grooves 126a, 126b, 126c, and 126d, thereby having a stepped side surface in the cross-sectional view.

In order to improve the coverage on the edges of the substrate, the light-transmitting resin layers are preferably made thicker because the thickness of the substrate is larger than that of the resin layers. Having a stacked layer structure, the light-transmitting resin layers can be made thicker. The shape of the obtained semiconductor device can be freely changed (varied) depending on the structure, thickness, and cutting portion of the light-transmitting resin layers. In FIGS. 1A and 1B, the light-transmitting resin layers are made thick; therefore, the edge of the light-transmitting substrate is aligned with the edge of the light-transmitting resin layers in each semiconductor device.

When a dicer having a dicing blade with a small width is used for division, a larger area of the groove of the light-transmitting substrate can be left in the obtained semiconductor device. When a light-transmitting resin layer functioning as an impact absorption material is stacked, the semiconductor device can have a higher tolerance to stress.

In addition, since the grooves are formed and then the light-transmitting resin layers are formed in the grooves, the thickness of the light-transmitting resin layers formed at the bottom of the grooves can be increased. Furthermore, the light-transmitting resin layers are formed to be stacked over the light-transmitting substrate, and then cut; thus, the edge of the light-transmitting resin layers is aligned with the edge of the light-transmitting substrate in the side surfaces. In the side surfaces, the top edge of the light-transmitting substrate is not exposed, leading to prevention of damage and dents on the edge of the light-transmitting substrate. In addition, by stacking the light-transmitting resin layers to increase their thickness, the distance between the edge of the light-transmitting substrate and the edge of the light-transmitting resin layers can be increased in the side surfaces of the semiconductor device, leading to further reduction in damage to the edge of the light-transmitting substrate.

The semiconductor device can be mounted on another substrate. As described in this embodiment mode, in the semiconductor device, the light-transmitting resin layers are not exposed on the side of the semiconductor element layer. Accordingly, the semiconductor device can have sufficient heat resistance to withstand the heat treatment that is performed to mount the semiconductor device with the use of a solder or an anisotropic conductive film.

In the semiconductor devices 112a, 112b, and 112c, the light-transmitting substrates 109a, 109b, and 109c that are processed to be thin are covered with the resin layers 110a, 110b, and 110c, respectively, and thus easy to be treated in the process, which leads to reduction in defects such as damage. Thus, a high-performance semiconductor device with a reduced thickness can be manufactured at a high yield.

In the semiconductor devices 112a, 112b, and 112c, conductive layers are formed on the surfaces of the semiconductor element layers, as the terminal electrodes 115a1, 115a2, 115b1, 115b2, 115c1, and 115c2 to provide electrical connection when the semiconductor devices 112a, 112b, and 112c are mounted.

For example, in the case where the conductive layers are formed by screen printing, the conductive layers can be provided by selectively printing a conductive paste in which conductive particles having a diameter of several nanometers to several tens of micrometers are dissolved or dispersed in an organic resin. As the conductive particles, it is possible to use metal particles of one or more of silver (Ag), gold (Au), copper (Cu), nickel (Ni), platinum (Pt), palladium (Pd), tantalum (Ta), molybdenum (Mo), titanium (Ti), and the like or fine particles of silver halide. As the organic resin contained in the conductive paste, one or more of organic resins functioning as a binder, a solvent, a dispersant, and a coating material of metal particles can be used. Typically, an organic resin such as an epoxy resin or a silicone resin can be used. When the conductive layers are formed, the conductive paste is preferably baked after being applied. Alternatively, fine particles that contain solder or lead-free solder as its main component may be used.

The semiconductor device and a wiring on a substrate on which the semiconductor device is mounted may be connected in such a manner that the wiring on the substrate is brought into contact with a bump that is a conductive raised portion provided on a terminal of the semiconductor device, and then the semiconductor device is fixed to the substrate with a resin. Alternatively, a resin in which conductive particles are dispersed may be provided between the wiring on the substrate and the electrode terminal of the semiconductor device, so that the semiconductor device is connected to the wiring on the substrate with the conductive particles and the semiconductor device is bonded and fixed to the substrate with the organic resin in which the conductive particles are dispersed. As the resin used for bonding, a photocurable resin, a thermosetting resin, a naturally curable resin, or the like can be used.

Figure 3A:
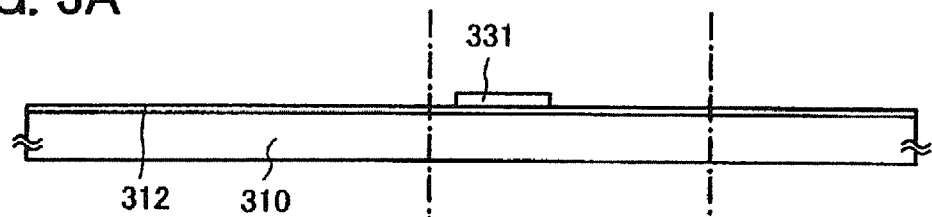
FIGS. 3A to 3D are diagrams illustrating a method of manufacturing a semiconductor device of the present invention.

A method in which a photoelectric conversion element and a field-effect transistor are formed over a substrate as semiconductor element layers to be divided is described with reference to the cross-sectional views of FIGS. 3A to 3D, FIGS. 4A to 4C, and FIGS. 5A and 5B. In FIG. 3A, AN 100, which is one of glass substrates, is used as a light-transmitting substrate 310. The use of a thin film transistor as a field-effect transistor formed over a substrate is advantageous in that a photoelectric conversion element and the thin film transistor can be manufactured over the substrate in the same process, and thus a semiconductor device can be easily mass-produced. Note that the photoelectric conversion element is irradiated with light through a light-transmitting resin layer functioning as a color filter and a light-transmitting substrate.

First, a silicon oxide film containing nitrogen (100 nm in thickness) is formed as a base insulating film 312 by plasma CVD, and a semiconductor film, for example, an amorphous silicon film containing hydrogen (54 nm in thickness) is stacked thereon without being exposed to the atmosphere. The base insulating film 312 may be a stack of a silicon oxide film, a silicon nitride film and a silicon oxide film containing nitrogen. For example, the base insulating film 312 may be a stack of a silicon nitride film containing oxygen with a thickness of 50 nm, and a silicon oxide film containing nitrogen with a thickness of 100 nm. Note that the silicon oxide film containing nitrogen or the silicon nitride film functions as a blocking layer that prevents diffusion of impurities such as an alkali metal from a glass substrate.

As a material for a semiconductor layer included in the semiconductor element, it is possible to use an amorphous semiconductor (hereinafter, also referred to as an AS) that is formed by sputtering or vapor-phase growth using a semiconductor material gas typified by silane or germane, a polycrystalline semiconductor that is obtained by crystallizing the amorphous semiconductor by utilizing light energy or thermal energy, a microcrystalline semiconductor (also referred to as a semi-amorphous or microcrystal semiconductor, and hereinafter, also referred to as an SAS), or the like. The semiconductor layer can be deposited by sputtering, LPCVD, plasma CVD, or the like.

Considering Gibbs free energy, the microcrystalline semiconductor film is in a metastable state that is intermediate between an amorphous state and a single crystal state. That is, the microcrystalline semiconductor is in a third state that is stable in free energy, and has short-range order and lattice distortion. Furthermore, columnar or needle-like crystals grow in the direction of the normal to the surface of the substrate. The Raman spectrum of microcrystalline silicon, which is a typical example of a microcrystalline semiconductor, is shifted to a lower wavenumber side than 520 cm$^{-1}$ that represents single crystal silicon. In other words, the Raman spectrum of microcrystalline silicon has a peak between 480 cm$^{-1}$ that represents amorphous silicon and 520 cm$^{-1}$ that represents single crystal silicon. Furthermore, the microcrystalline semiconductor film contains 1 at. % or more of hydrogen or halogen to terminate dangling bonds. The microcrystalline semiconductor film may contain a rare gas element such as helium, argon, krypton, or neon to further promote lattice distortion, whereby a favorable microcrystalline semiconductor film with improved stability can be obtained.

This microcrystalline semiconductor film can be formed using a high-frequency plasma CVD apparatus with a frequency of several tens of megahertz to several hundreds of megahertz, or a microwave plasma CVD apparatus with a frequency of 1 GHz or more. Typically, the microcrystalline semiconductor film can be formed using silicon hydride (e.g., $SiH_4$, $Si_2H_6$, $SiH_2Cl_2$, $SiHCl_3$, $SiC_4$, or $SiF_4$) that is diluted with hydrogen. Furthermore, the microcrystalline semiconductor film can be formed with a dilution of silicon hydride, hydrogen, and one or more kinds of rare gas elements selected from helium, argon, krypton, and neon. In such a case, the flow rate of hydrogen is 5 to 200 times, preferably 50 to 150 times, and more preferably 100 times higher than that of silicon hydride.

The amorphous semiconductor is typified by hydrogenated amorphous silicon, and the crystalline semiconductor is typified by polysilicon or the like. Polysilicon (polycrystalline silicon) includes so-called high-temperature polysilicon that contains polysilicon formed at a process temperature of 800° C. or higher as its main component, so-called low-temperature polysilicon that contains polysilicon formed at a process temperature of 600° C. or lower as its main component, and polysilicon formed by crystallizing amorphous silicon by using, for example, an element that promotes crystallization. It is needless to say that a microcrystalline semiconductor or a semiconductor partially including a crystalline phase can also be used as described above.

As a material for the semiconductor, a compound semiconductor such as GaAs, InP, SiC, ZnSe, GaN, or SiGe can be used as well as an element such as silicon (Si) or germanium (Ge). It is also possible to use an oxide semiconductor such as zinc oxide (ZnO) or tin oxide ($SnO_2$). In the case of using ZnO for the semiconductor layer, a gate insulating layer is preferably formed of $Y_2O_3$, $Al_2O_3$, $TiO_2$, a stack thereof, or the like, and a gate electrode layer, a source electrode layer, and a drain electrode layer are preferably formed of ITO, Au, Ti, or the like. In addition, In, Ga, or the like may be added to ZnO.

In the case of using a crystalline semiconductor film for the semiconductor layer, the crystalline semiconductor film may be formed by various methods (e.g., laser crystallization, thermal crystallization, or thermal crystallization using an element such as nickel that promotes crystallization). Alternatively, a microcrystalline semiconductor, which is an SAS, may be crystallized by laser irradiation to increase crystallinity. In the case where an element that promotes crystallization is not introduced, before being irradiated with laser light, an amorphous semiconductor film is heated at 500° C. for one hour under a nitrogen atmosphere, whereby hydrogen contained in the amorphous semiconductor film is released to a concentration of $1 \times 10^{20}$ atoms/cm$^3$ or less. This is because, if the amorphous semiconductor film contains much hydrogen, the amorphous semiconductor film is broken by laser irradiation.

There is no particular limitation on a method of introducing a metal element into the amorphous semiconductor film as long as the metal element can exist on the surface of or inside the amorphous semiconductor film. For example, a sputtering method, a CVD method, a plasma processing method (including a plasma CVD method), an adsorption method, or a method of applying a metal salt solution can be employed. Among them, the method using a solution is simple and easy, and is useful in terms of easy concentration adjustment of the metal element. At this time, an oxide film is preferably deposited by UV light irradiation in an oxygen atmosphere, thermal oxidation, treatment with ozone water or hydrogen peroxide including a hydroxyl radical, or the like in order to improve the wettability of the surface of the amorphous semiconductor film and to spread an aqueous solution over the entire surface of the amorphous semiconductor film.

In a crystallization step for crystallizing the amorphous semiconductor film to form a crystalline semiconductor film, an element that promotes crystallization (also referred to as a catalytic element or a metal element) may be added to the amorphous semiconductor film, and crystallization may be performed by heat treatment (at 550° C. to 750° C. for 3 minutes to 24 hours). As the element that promotes crystallization, it is possible to use one or more kinds of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au).

In order to remove or reduce the element that promotes crystallization from the crystalline semiconductor film, a semiconductor film containing an impurity element is formed in contact with the crystalline semiconductor film so as to function as a gettering sink. As the impurity element, an impurity element imparting n-type conductivity, and an impurity element imparting p-type conductivity, a rare gas element, or the like can be used. For example, it is possible to use one or more kinds of elements selected from phosphorus (P), nitrogen (N), arsenic (As), antimony (Sb), bismuth (Bi), boron (B), helium (He), neon (Ne), argon (Ar), krypton (Kr), and xenon (Xe). A semiconductor film containing a rare gas element is formed in contact with the crystalline semiconductor film containing the element that promotes crystallization, and then heat treatment is performed (at 550° C. to 750° C. for 3 minutes to 24 hours). The element promoting crystallization that is contained in the crystalline semiconductor film moves into the semiconductor film containing a rare gas element, and thus the element promoting crystallization that is contained in the crystalline semiconductor film is removed or reduced. After that, the semiconductor film containing a rare gas element, which has functioned as a gettering sink, is removed.

The amorphous semiconductor film may be crystallized by a combination of thermal treatment and laser light irradiation. Alternatively, either thermal treatment or laser light irradiation may be performed a plurality of times.

A crystalline semiconductor film can also be formed directly over the substrate by a plasma method. Alternatively, a crystalline semiconductor film may be selectively formed over the substrate by a plasma method.

In this embodiment mode, as the semiconductor film, a polycrystalline silicon film is formed by a crystallization method using a catalytic element. A nickel acetate solution containing 10 ppm by weight of nickel is applied by a spinner. Instead of applying the solution, a nickel element may be dispersed over the entire surface by sputtering. Then, heat treatment for crystallization is performed to form a semiconductor film having a crystalline structure (here, a polycrystalline silicon film). Here, a polycrystalline silicon film is obtained by performing heat treatment (at 500° C. for one hour), and then performing heat treatment for crystallization (at 550° C. for four hours).

Next, an oxide film over a surface of the polycrystalline silicon film is removed by dilute hydrofluoric acid or the like. After that, laser light irradiation (XeCl: a wave length of 308 nm) is performed in an atmospheric air or an oxygen atmosphere in order to increase crystallinity and repair defects remaining in crystal grains.

Excimer laser light having a wavelength of 400 nm or less, or the second harmonic or the third harmonic of a YAG laser is used for the laser light. Here, pulsed laser light having a repetition rate of approximately 10 Hz to 1000 Hz is used. The laser light is condensed to 100 mJ/cm$^2$ to 500 mJ/cm$^2$ by an optical system, and irradiation is performed with an overlap rate of 90% to 95% to scan the silicon film surface. In this embodiment mode, laser light irradiation is performed in an atmospheric air at a repetition rate of 30 Hz and an energy density of 470 mJ/cm$^2$.

Note that an oxide film is formed over the surface by the laser light irradiation because the laser light irradiation is performed in an atmospheric air or an oxygen atmosphere. Although an example of using a pulsed laser is shown in this embodiment mode, a continuous-wave laser may be used instead. In order to obtain a crystal with a large grain size at the time of crystallization of a semiconductor film, it is preferable to use a continuous-wave solid-state laser and to apply the second harmonic to the fourth harmonic of a fundamental wave. Typically, the second harmonic (532 nm) or the third harmonic (355 nm) of an Nd:YVO$_4$ laser (fundamental wave: 1064 nm) may be applied.

In the case of using a continuous-wave laser, laser light emitted from a continuous-wave YVO$_4$ laser with an output of 10 W is converted into a harmonic by a non-linear optical element. Alternatively a harmonic may be emitted by putting a YVO$_4$ crystal and a non-linear optical element in a resonator. Then, the laser light is preferably shaped into a rectangular shape or an elliptical shape on the irradiation surface by an optical system, and then emitted to an object to be processed. At this time, an energy density of about 0.01 MW/cm$^2$ to 100 MW/cm$^2$ (preferably, 0.1 MW/cm$^2$ to 10 MW/cm$^2$) is necessary. The semiconductor film may be irradiated with laser light while moving relative to the laser light at a rate of about 10 cm/s to 2000 cm/s.

Then, the surface is treated with ozone water for 120 seconds to form a barrier layer including an oxide film in addition to the oxide film formed by the aforementioned laser light irradiation, which has a total thickness of 1 nm to 5 nm. This barrier layer is formed to remove the catalytic element added for crystallization, for example, nickel (N), from the film. Although the barrier layer here is formed using ozone water here, the barrier layer may be formed by depositing an oxide film with a thickness of about 1 nm to 10 nm by the following method: a method in which the surface of the semiconductor film having a crystalline structure is oxidized by UV irradiation under an oxygen atmosphere or oxygen plasma treatment; a plasma CVD method; a sputtering method; a vapor deposition method; or the like. Before the barrier layer is formed, the oxide film formed by the laser light irradiation may be removed.

Next, an amorphous silicon film containing an argon element, which functions as a gettering site, is deposited over the barrier layer by sputtering to a thickness of 10 nm to 400 nm, here, a thickness of 100 nm. Here, the amorphous silicon film containing an argon element is formed using a silicon target under an atmosphere containing argon. In the case where the amorphous silicon film containing an argon element is formed by plasma CVD, the deposition conditions are as follows: the flow rate of monosilane and argon (SiH$_4$:Ar) is 1:99, the deposition pressure is 6.665 Pa, the RF power density is 0.087 W/cm$^2$, and the deposition temperature is 350° C.

Subsequently, heat treatment is performed for three minutes in a furnace heated to 650° C., thereby removing (gettering) the catalytic element. As a result, the concentration of the catalytic element in the semiconductor film having a crystalline structure is reduced. Instead of the furnace, a lamp annealing apparatus may be used.

Next, the amorphous silicon film containing an argon element, which is a gettering site, is selectively removed using the barrier layer as an etching stopper, and then the barrier layer is selectively removed using dilute hydrofluoric acid. Note that nickel tends to move to a region having a high concentration of oxygen in gettering; thus, the barrier layer including the oxide film is preferably removed after gettering.

In the case where the semiconductor film is not crystallized using the catalytic element, it is not necessary to perform the aforementioned steps such as the formation of the barrier layer, the formation of the gettering site, the heat treatment for gettering, the removal of the gettering site, and the removal of the barrier layer.

Subsequently, a thin oxide film is formed using ozone water over a surface of the obtained semiconductor film having a crystalline structure (e.g., a crystalline silicon film).

Then, a resist mask is formed using a first photomask and the semiconductor film is etched into a desired shape, whereby a semiconductor layer 331 that is separated into an island shape is formed (see FIG. 3A). After the semiconductor layer 331 is formed, the resist mask is removed.

Then, if necessary, a small amount of impurity element (boron or phosphorus) is added to control the threshold voltage of a transistor. Here, an ion doping method in which diborane (B$_2$H$_6$) is not excited by plasma without mass separation is used.

Subsequently, at the same time as the removal of the oxide film using an etchant containing hydrofluoric acid, the surface of the semiconductor layer 331 is cleaned. Then, an insulating film 313 is formed.

The gate insulating film 313 may be formed of silicon oxide, or a stack of silicon oxide and silicon nitride. The gate insulating film 313 may be formed by depositing an insulating film by plasma CVD or reduced pressure CVD, or formed by solid-phase oxidation or solid-phase nitridation by plasma treatment. This is because a gate insulating film formed by oxidizing or nitriding a semiconductor layer by plasma treatment is dense and has high withstand voltage and reliability. For example, the surface of the semiconductor layer is oxidized or nitrided using nitrous oxide (N$_2$O) diluted with Ar by 1 to 3 times (flow rate), at a microwave (2.45 GHz) power of 3 kW to 5 kW and a pressure of 10 Pa to 30 Pa. An insulating film with a thickness of 1 nm to 10 nm (preferably, 2 nm to 6 nm) is formed by this treatment. Furthermore, nitrous oxide (N$_2$O) and silane (SiH$_4$) are introduced and a microwave (2.45 GHz) power of 3 kW to 5 kW is applied at a pressure of 10 Pa to 30 Pa, whereby a silicon oxynitride film is formed by vapor-phase growth to form the gate insulating film. By combining the solid-phase reaction and the vapor-phase growth, a gate insulating film having a low interface state density and a high withstand voltage can be obtained.

The gate insulating film 313 may also be formed using a high dielectric constant material such zirconium dioxide, hafnium oxide, titanium dioxide, or tantalum pentoxide. By using the high dielectric constant material for the gate insulating film 313, the gate leakage current can be reduced.

In this embodiment mode, as the gate insulating film 313, a silicon oxide film containing nitrogen is formed to a thickness of 115 nm by plasma CVD.

Figure 3B:
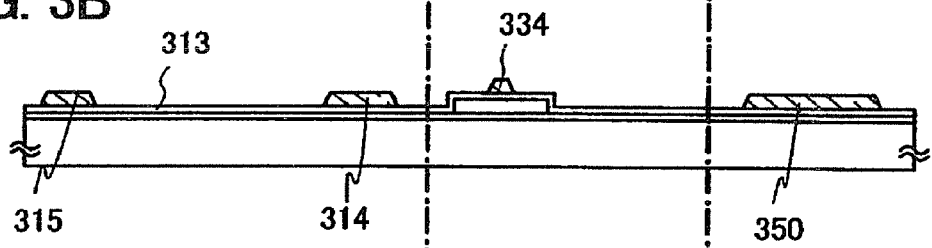
Figure 3C:
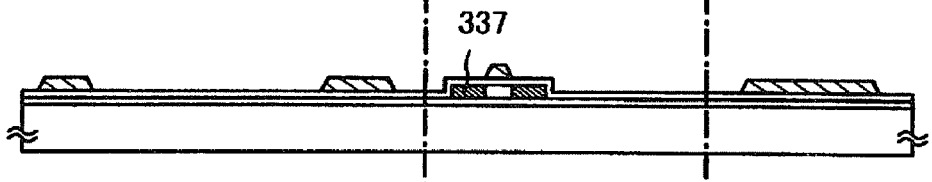

Subsequently, a metal film is formed over the gate insulating film 313, and then, a gate electrode 334, wirings 314 and 315, and a terminal electrode 350 are formed using a second photomask (see FIG. 3B). As the metal film, for example, a tantalum nitride film with a thickness of 30 nm and a tungsten (W) film with a thickness of 370 nm are stacked.

The gate electrode 334, the wirings 314 and 315, and the terminal electrode 350 can also be formed using the following films as well as the aforementioned films: a single-layer film made of an element selected from titanium (Ti), tungsten (W), tantalum (Ta), molybdenum (Mo), neodymium ed), cobalt (Co), zirconium (Zr), zinc (Zn), ruthenium (Ru), rhodium (Rh), palladium (Pd), osmium (Os), iridium (r), platinum (Pt), aluminum (Al), gold (Au), silver (Ag), and copper (Cu), or an alloy material or a compound material containing such an element as its main component; or a single-layer film made of nitride of such an element, for example, titanium nitride, tungsten nitride, tantalum nitride, or molybdenum nitride.

Alternatively, the gate electrode 334, the wirings 314 and 315, and the terminal electrode 350 may be formed of a light-transmitting material that transmits visible light. As the light-transmitting conductive material, indium tin oxide (ITO), indium tin oxide containing silicon oxide (ITSO), organic indium, organotin, zinc oxide, or the like can be used.

It is also possible to use indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like.

Then, an impurity imparting one conductivity type is introduced into the semiconductor layer 331, whereby a source or drain region 337 of a transistor 373 (see FIG. 3C) is formed. Since an n-channel transistor is formed in this embodiment mode, an impurity imparting n-type conductivity, such as phosphorus (P) or arsenic (As), is introduced into the semiconductor layer 331. In the case of forming a p-channel transistor, an impurity imparting p-type conductivity, such as boron (B), may be introduced into the semiconductor layer 331.

Subsequently, a first interlayer insulating film (not illustrated) including a silicon oxide film is formed to a thickness of 50 nm by CVD. Then, the impurity element added to each island-like semiconductor region is activated. This activation step is performed by rapid thermal annealing (RTA) using a lamp light source, YAG laser or excimer laser irradiation from the back side, heat treatment using a furnace, or a combination of any of such methods.

Next, a second interlayer insulating film 316 including a silicon nitride film containing hydrogen and oxygen is formed to a thickness of, for example, 10 nm.

Figure 3D:
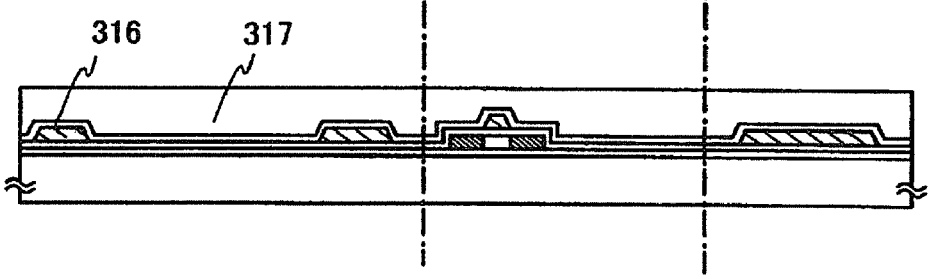

Then, a third interlayer insulating film 317 made of an insulating material is formed over the second interlayer insulating film 316 (see FIG. 3D). As the third interlayer insulating film 317, an insulating film obtained by CVD can be used. In this embodiment mode, in order to improve adhesion, a silicon oxide film containing nitrogen formed to a thickness of 900 nm is used as the third interlayer insulating film 317.

Then, heat treatment is performed (at 300° C. to 550° C. for 1 to 12 hours, for example, at 410° C. for one hour in a nitrogen atmosphere) so as to hydrogenate the semiconductor layer. This step is performed to terminate dangling bonds in the semiconductor layer by hydrogen contained in the second interlayer insulating film 316. The semiconductor layer can be hydrogenated regardless of the existence of the gate insulating film 313.

As the third interlayer insulating film 317, an insulating film using siloxane, or a stack thereof can also be used. Siloxane has a skeleton structure formed by a bond of silicon (Si) and oxygen (O). As a substituent, a compound containing at least hydrogen (e.g., an alkyl group or an aryl group) is used. Fluorine may also be used as a substituent. Furthermore, fluorine and a compound containing at least hydrogen may also be used as a substituent.

In the case where an insulating film using siloxane or a stack thereof is used as the third interlayer insulating film 317, heat treatment for hydrogenating the semiconductor layer may be performed after the second interlayer insulating film 316 is formed, and then the third interlayer insulating film 317 may be formed.

Subsequently, a resist mask is formed using a third photomask, and the first interlayer insulating film, the second interlayer insulating film 316, and the third interlayer insulating film 317, and/or the gate insulating film 313 are selectively etched to form a contact hole. Then, the resist mask is removed.

Note that the third interlayer insulating film 317 is not necessarily formed. In the case where the third interlayer insulating film 317 is not formed, after the second interlayer insulating film 316 is formed, the first interlayer insulating film, the second interlayer insulating film 316, and the gate insulating film 313 are selectively etched to form a contact hole.

Next, after a stacked metal film is deposited by sputtering, a resist mask is formed using a fourth photomask and the metal film is selectively etched, whereby a wiring 319, a connection electrode 320, a terminal electrode 351, and a source or drain electrode 341 of the transistor 373 are formed. Then, the resist mask is removed. Note that in this embodiment mode, the metal film is a three-layer film of a Ti film with a thickness of 100 nm, an Al film containing a small amount of Si with a thickness of 350 nm, and a Ti film with a thickness of 100 nm.

In the case where the wiring 319, the connection electrode 320, the terminal electrode 351, and the source or drain electrode 341 of the transistor 373 are formed using a single-layer conductive film, a titanium (Ti) film is preferably used in terms of heat resistance, conductivity, and the like. Instead of the titanium film, it is possible to use a single-layer film made of an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt), or an alloy material or a compound material containing such an element as its main component, or a single-layer film made of nitride of such an element, for example, titanium nitride, tungsten nitride, tantalum nitride, or molybdenum nitride. The number of times of deposition in the manufacturing process can be reduced by forming each of the wiring 319, the connection electrode 320, the terminal electrode 351, and the source or drain electrode 341 of the transistor 373 using a single-layer film.

Through the aforementioned steps, the top gate transistor 373 using a polycrystalline silicon film as the semiconductor layer can be manufactured.

In this embodiment mode, an n-channel transistor is shown as an example of the semiconductor element included in the semiconductor element layer; however, a p-channel transistor may be used instead. Various kinds of field-effect transistors can be used and there is no limitation on the kind of transistors to be used.

Although a single-gate transistor is described in this embodiment mode, a multi-gate transistor such as a double-gate transistor may also be used. In that case, a gate electrode layer may be provided above and below a semiconductor layer, or a plurality of gate electrode layers may be provided only on one side of (above or below) the semiconductor layer.

A transistor may be formed by ink-jet or printing. In this case, the transistor can be manufactured at room temperature, at a low vacuum, and over a large substrate. In addition, since the transistor can be manufactured without using masks (reticles), the layout of the transistor can be easily changed. Furthermore, it is not necessary to use a resist, leading to reduction in material cost and the number of steps. Still further, a film is formed only at a necessary portion; thus, the amount of wasted material can be reduced to reduce cost as compared with a manufacturing method in which a film is deposited over the entire surface and then etched.

Alternatively, it is possible to use a transistor including an organic semiconductor or a carbon nanotube, or the like. In this case, the transistor can be formed over a substrate that can be bent, and thus can have higher resistance to impact.

Further alternatively, as the semiconductor element, a transistor may be formed using a light-transmitting substrate having an SOI structure that uses a single crystal semiconductor layer. In this case, a transistor with high current supply capability and a small size can be manufactured with few variations in characteristics, size, shape, and the like. By using such a transistor, lower power consumption or higher integration of circuits can be achieved.

As for a plurality of field-effect transistors provided in a semiconductor device, all the circuits necessary for realizing predetermined functions may be formed over the same light-transmitting substrate, or circuits may be formed over different substrates depending on the respective functions and may be electrically connected to each other by mounting. The semiconductor device of this embodiment mode can be formed over a light-transmitting substrate such as a glass substrate by forming field-effect transistors using thin film transistors. Accordingly, even when a photoelectric conversion element is formed over the top surface of a substrate, the photoelectric conversion element can receive light that is emitted from the back surface of the substrate and transmitted through the light-transmitting substrate.

Next, a conductive metal film (titanium (Ti), molybdenum (Mo), or the like) that does not easily react with a photoelectric conversion layer (typically, amorphous silicon) to be formed later and does not form an alloy is deposited. After that, a resist mask is formed using a fifth photomask, and the conductive metal film is selectively etched to form a protective electrode 318, a protective electrode 345, a protective electrode 346, and a protective electrode 348 to cover the wiring 319 (see FIG. 4A). Here, a Ti film with a thickness of 200 nm is formed by sputtering. Note that the connection electrode 320, the terminal electrode 351, and the source or drain electrode 341 of the transistor 373 are also covered with the conductive metal film. Accordingly, the conductive metal film covers the side surfaces of these electrodes on which the second-layer Al film is exposed, thereby preventing aluminum atoms from diffusing into the photoelectric conversion layer.

Note that in the case where the wiring 319, the connection electrode 320, the terminal electrode 351, and the source or drain electrode 341 of the transistor 373 are formed using a single-layer conductive film, it is not necessary to provide the protective electrode 318, the protective electrode 345, the protective electrode 346, and the protective electrode 348.

Next, a photoelectric conversion layer 371 including a p-type semiconductor layer 371p, an i-type semiconductor layer 371i, and an n-type semiconductor layer 371n is formed over the third interlayer insulating film 317.

The p-type semiconductor layer 371p may be formed by depositing a semi-amorphous (also referred to as microcrystalline or microcrystal) silicon film containing an impurity element belonging to Group 13 of the periodic table, such as boron (B), by plasma CVD.

The microcrystalline silicon film is formed by, for example, glow discharge plasma using a mixture of silane gas and hydrogen and/or a rare gas. Silane is diluted 10 to 2000 times with hydrogen and/or a rare gas; therefore, a large amount of hydrogen and/or a rare gas is needed. The heating temperature of the substrate is 100° C. to 300° C., and preferably 120° C. to 220° C. The deposition is preferably performed at a temperature of 120° C. to 220° C. in order that the growing surface of the microcrystalline silicon film is inactivated with hydrogen to promote the growth of microcrystalline silicon. During the deposition treatment, a SiH radical, a SiH$_2$ radical, and a SiH$_3$ radical that are active species contribute to crystal growth from crystal nuclei. Furthermore, in order to adjust the energy band width, germanium hydride such as GeH$_4$ or germanium fluoride such as GeF$_4$ may be mixed into a gas such as silane, or carbon or germanium may be added to silicon. When carbon is added to silicon, the energy band width increases, and when germanium is added to silicon, the energy band width decreases.

The wiring 319 and the protective electrode 318 are in contact with the lowermost layer of the photoelectric conversion layer 371, in this embodiment mode, the p-type semiconductor layer 371p.

After the p-type semiconductor layer 371p is formed, the i-type semiconductor layer 371i and the n-type semiconductor layer 371n are formed in order. Thus, the photoelectric conversion layer 371 including the p-type semiconductor layer 371p, the i-type semiconductor layer 371i, and the n-type semiconductor layer 371n is formed.

As the i-type semiconductor layer 371i, for example, a microcrystalline silicon film may be formed by plasma CVD. As the n-type semiconductor layer 371n, a microcrystalline silicon film containing an impurity element belonging to Group 15 of the periodic table, such as phosphorus (P), may be formed, or after a microcrystalline silicon film is formed, an impurity element belonging to Group 15 of the periodic table may be introduced thereinto.

As the p-type semiconductor layer 371p, the i-type semiconductor layer 371i, and the n-type semiconductor layer 371n, an amorphous semiconductor film may be used instead of the microcrystalline semiconductor film. Alternatively, the aforementioned polycrystalline semiconductor film formed using a catalytic element or laser crystallization may be used.

Furthermore, when the photoelectric conversion layer is formed using microcrystalline silicon or single crystal silicon formed by Smart Cut (registered trademark), variations in characteristics on the surface of the substrate can be reduced.

Figure 4A:
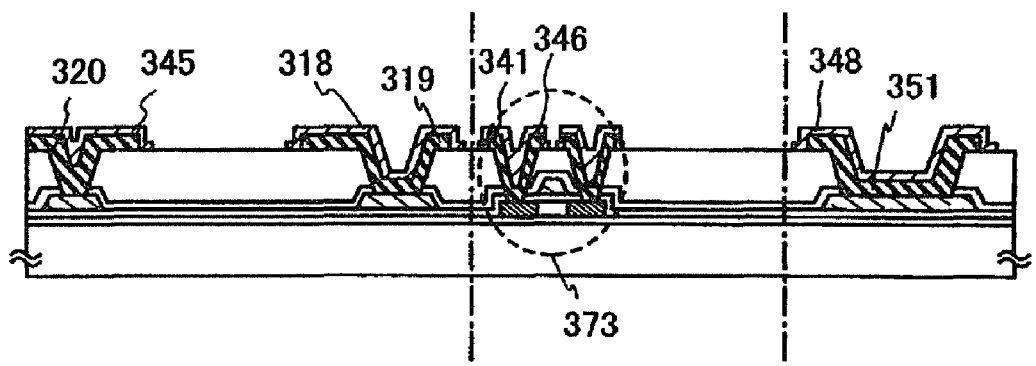
FIGS. 4A to 4C are diagrams illustrating a method of manufacturing a semiconductor device of the present invention.
Figure 4B:
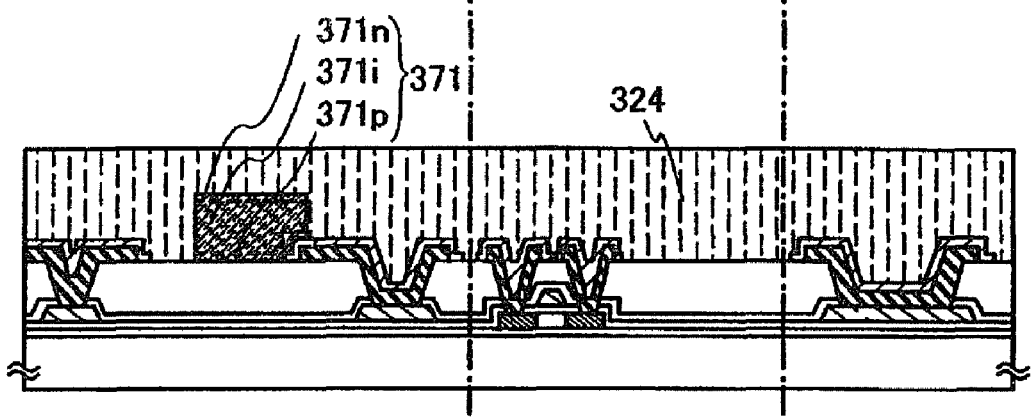
Figure 4C:
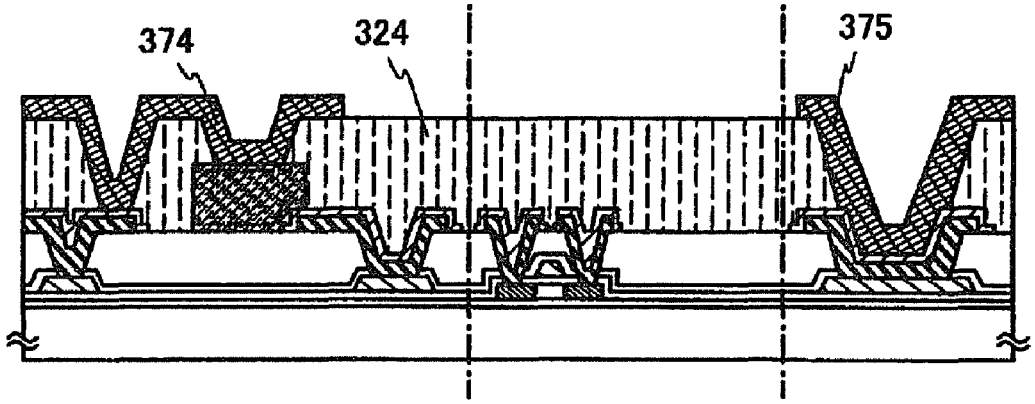

Subsequently, a sealing layer 324 made of an insulating material (e.g., an inorganic insulating film containing silicon) is formed over the entire surface to a thickness of 1 μm to 30 μm, whereby the state of FIG. 4B is obtained. Here, as the insulating material film, a silicon oxide film containing nitrogen with a thickness of 1 μm is formed by CVD. By using the insulating film formed by CVD, adhesion is improved.

Next, the sealing layer 324 is etched to form openings, and then, wirings 374 and 375 are formed by sputtering. As the wirings 374 and 375, a titanium (Ti) film is deposited to a thickness of 200 nm by sputtering.

Figure 5A:
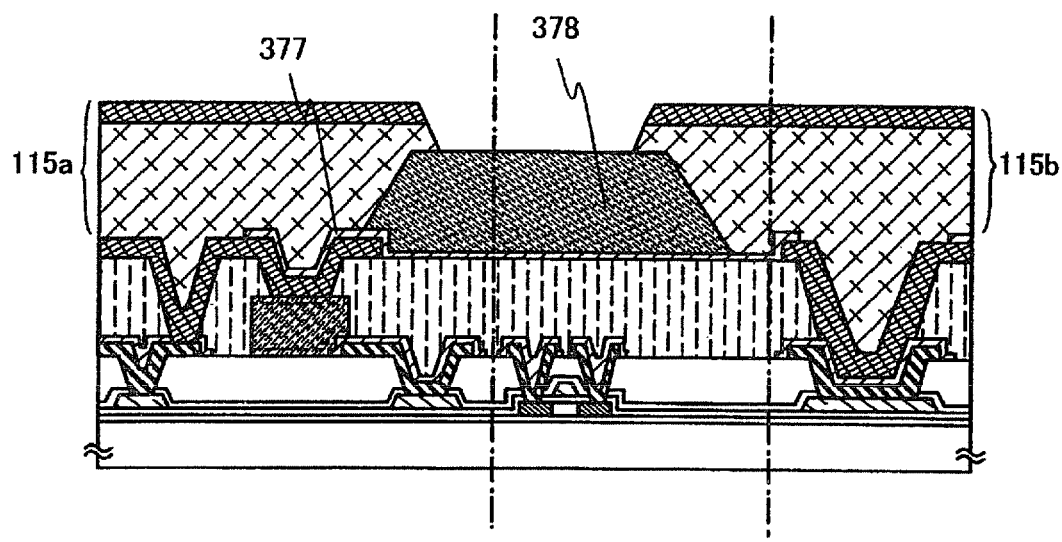
FIGS. 5A and 5B are diagrams illustrating a method of manufacturing a semiconductor device of the present invention.

Next, a protective film 377 is formed to cover an exposed surface (see FIG. 5A). In this embodiment mode, a silicon nitride film is used as the protective film 377. This protective film 377 prevents impurities such as moisture and organic substances from being mixed into the photoelectric conversion layer 371 and the transistor 373.

Then, a sealing film 378 is formed over the protective film 377. The sealing film 378 also has a function of protecting the semiconductor element layers from external stress. In this embodiment mode, the sealing film 378 is formed to a thickness of 20 μm using a photosensitive epoxy-phenol-based resin. As the sealing film 378, OHMCOAT 1012B (produced by Namics Corporation), which is an epoxy-phenol-based resin, may be used.

Subsequently, the protective film 377 in a region where terminal electrodes of the top layer are electrically connected to the wiring 374 or the wiring 375 of the bottom layer is etched, so as to form contact holes.

Then, by using nickel (Ni) paste for example, a stack of a titanium (Ti) film (150 nm), a nickel (Ni) film (750 nm), and a gold (Au) film (50 nm) is formed over the sealing film 378 by sputtering. The thus obtained terminal electrodes 115a1 and 115a2 have an adhesion strength of 5 N or more, which is a sufficient adhesion strength for a terminal electrode.

Figure 5B:
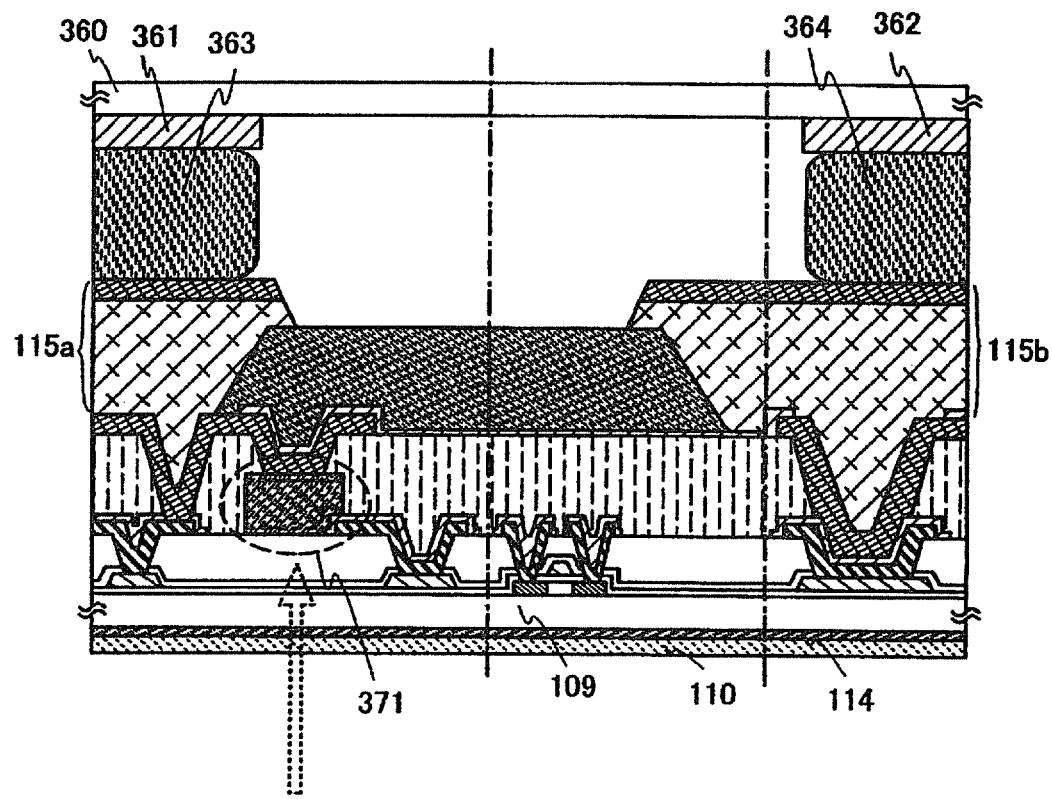

Through the aforementioned steps, the terminal electrodes 115a1 and 115a2 that can be connected by solder are formed, whereby the structure illustrated in FIG. 5B is obtained.

In practice, one optical sensor element including the photoelectric conversion layer, the TFT, and the like, which is obtained in FIG. 5B, can be mass-produced by forming each element material over a large substrate. A large number of photoelectric conversion elements (e.g., 2 mm×1.5 mm) can be manufactured on one large substrate (e.g., 600 cm×720 cm). Such a state is illustrated in FIGS. 6A and 6B.

Figure 6A:
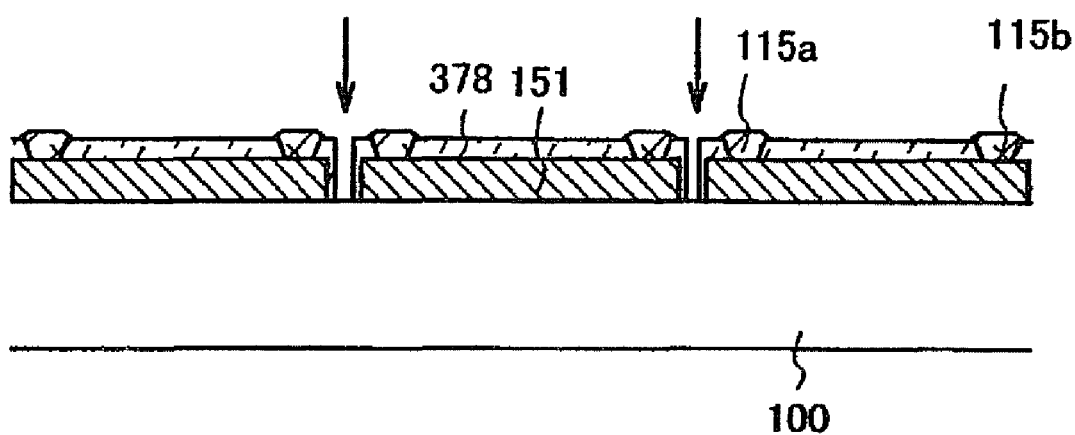
FIGS. 6A and 6B are diagrams illustrating a method of manufacturing a semiconductor device of the present invention.
Figure 6B:
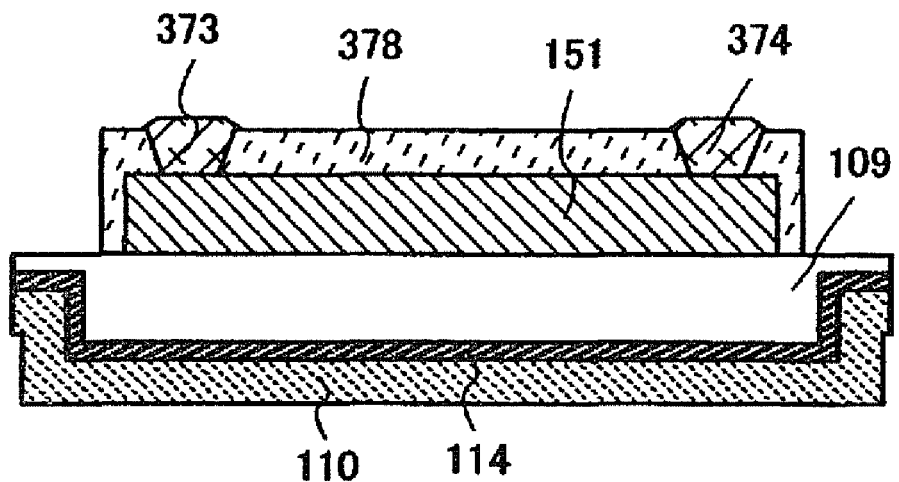

In FIG. 6A, an element layer 151, the sealing film 378, and the terminal electrodes 115a1 and 115a2 are formed over the light-transmitting substrate 100. In FIGS. 6A and 6B, the element layer 151 includes the whole structure formed between the light-transmitting substrate 100 and the sealing film 378.

The light-transmitting substrate 100 is divided between adjacent element layers 151, whereby the light-transmitting substrate 109 including each element is obtained.

The thus formed light-transmitting substrate 109 including the semiconductor element layer 101 is mounted on a substrate 360 with the terminal electrodes 115a1 and 115a2 connected by solders 363 and 364, respectively (see FIG. 5B). Note that an electrode 361 on the substrate 360 is mounted on the terminal electrode 115a1 by the solder 363, while an electrode 362 on the substrate 360 is mounted on the terminal electrode 115a2 by the solder 364.

In the photoelectric conversion element illustrated in FIG. 5B, by using the light-transmitting substrate 109 and the light-transmitting resin layers 110 and 114, light can enter the photoelectric conversion layer 371 from the side of the light-transmitting substrate 109 and the light-transmitting resin layers 110 and 114.

By the aforementioned method, a photoelectric conversion element can be manufactured at lower unit price and higher yield. Note that the photoelectric conversion element is described as an example of the element; however, the invention disclosed in this specification is characterized by the method of cutting the element, and can thus be applied to any other elements that are manufactured by dividing a substrate.

As described above, the surface of the light-transmitting substrate opposite to the surface over which the semiconductor element layer is formed, and part of the edges of the light-transmitting substrate are covered with the resin. Accordingly, occurrence of dents or cracks can be reduced, leading to increase in yield of the semiconductor device.

Thus, it is possible to provide a semiconductor device that is easy to be handled and has high reliability even if it has a small thickness.

In addition, the thickness of the light-transmitting substrate is reduced before the light-transmitting substrate is divided, and the dividing step is performed in two steps; therefore, it is possible to reduce the wear of a cutting tool in the process of dividing the light-transmitting substrate. The processing region of a cutting tool is increased with an increase in size of a light-transmitting substrate and a decrease in size of a semiconductor device to be divided, which causes a further increase in wear of the cutting tool. Accordingly, the invention disclosed in this specification, which can reduce the wear of a cutting tool, is particularly effective for a large substrate and a smaller semiconductor device. A semiconductor device can thus be manufactured at a lower cost. Since a light-transmitting substrate has a small thickness, the size of a semiconductor device can be reduced.

Embodiment Mode 2

In the semiconductor device disclosed in this specification, various kinds of field-effect transistors can be used as a semiconductor element included in a semiconductor element layer. In this embodiment mode, a field-effect transistor including a single crystal semiconductor layer will be described in detail as an applicable semiconductor element.

A method in which a semiconductor element included in a semiconductor element layer is formed over a light-transmitting substrate by forming a single crystal semiconductor layer using a single crystal semiconductor substrate will be described below with reference to FIGS. 15A to 15D and FIGS. 16A to 16C.

Figure 15A:
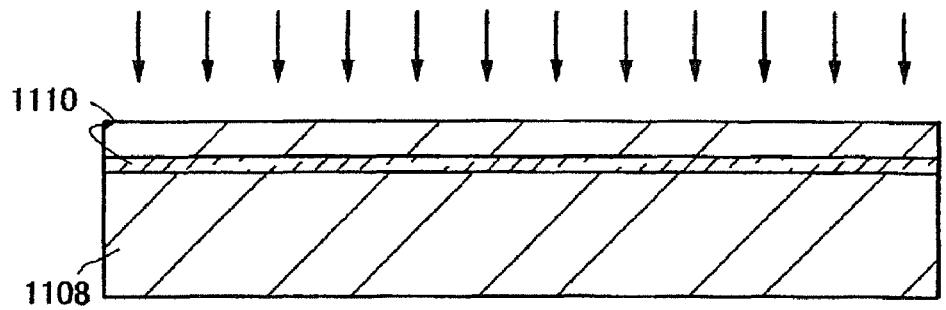
FIGS. 15A to 15D are diagrams illustrating a method of manufacturing a semiconductor device of the present invention.

A single crystal semiconductor substrate 1108 illustrated in FIG. 15A is cleaned, and ions accelerated by an electric field are added (introduced) to a predetermined depth from the surface thereof, whereby an embrittlement layer 1110 is formed. Ion addition is performed in consideration of the thickness of a single crystal semiconductor layer that is to be transferred to a light-transmitting substrate. Ions are added to the single crystal semiconductor substrate 1108 at an accelerating voltage determined in accordance with such a thickness. In this specification, a region that is embrittled by adding ions to a single crystal semiconductor substrate so as to include microvoids due to the ions is referred to as an embrittlement layer.

A commercial single crystal semiconductor substrate can be used as the single crystal semiconductor substrate 1108. For example, a single crystal semiconductor substrate including an element belonging to Group 4, such as a single crystal silicon substrate, a single crystal germanium substrate, or a single crystal silicon-germanium substrate can be used. Alternatively, a compound semiconductor substrate formed of gallium arsenide, indium phosphide, or the like can be used. As the semiconductor substrate, a polycrystalline semiconductor substrate may also be used. It is needless to say that the single crystal semiconductor substrate is not limited to a circular wafer, and single crystal semiconductor substrates with various shapes can be used. For example, a polygonal substrate such as a rectangular substrate, a pentagonal substrate, or a hexagonal substrate can be used. Needless to say, a commercial circular single crystal semiconductor wafer can also be used as the single crystal semiconductor substrate. As the circular single crystal semiconductor wafer, there are a semiconductor wafer of silicon, germanium, or the like, a compound semiconductor wafer of gallium arsenide, indium phosphide, or the like, and the like. The single crystal semiconductor wafer is typified by circular single crystal silicon wafers that are 5 inches (125 mm) in diameter, 6 inches (150 mm) in diameter, 8 inches (200 mm) in diameter, 12 inches (300 mm) in diameter, 400 mm in diameter, and 450 mm in diameter. Moreover, a rectangular single crystal semiconductor substrate can be formed by cutting a commercial circular single crystal semiconductor wafer. The substrate can be cut with a cutting device such as a dicer or a wire saw, laser cutting, plasma cutting, electron beam cutting, or any other appropriate cutting means. Alternatively, a rectangular single crystal semiconductor substrate can be formed in such a way that an ingot for manufacturing a semiconductor substrate before being sliced into a substrate is processed into a rectangular solid so as to have a rectangular cross section and the rectangular solid ingot is sliced. There is no particular limitation on the thickness of the single crystal semiconductor substrate. However, the thicker a single crystal semiconductor substrate is, the more single crystal semiconductor layers can be obtained from one piece of material wafer. Therefore, it is preferable that the single crystal semiconductor substrate be thick in terms of reusing the single crystal semiconductor substrate. The size of single crystal silicon wafers on the market conforms to SEMI standards, which specify that, for example, a wafer with a diameter of 6 inches has a thickness of 625 µm, a wafer with a diameter of 8 inches has a thickness of 725 µm, and a wafer with a diameter of 12 inches has a thickness of 775 µm. Note that the thickness of a wafer conforming to SEMI standards has a tolerance of ±25 µm. It is needless to say that the thickness of the single crystal semiconductor substrate to be a material wafer is not limited to SEMI standards, and the thickness can be adjusted as appropriate when an ingot is sliced. Naturally, when the single crystal semiconductor substrate 1108 is reused, the thickness of the substrate is smaller than that of SEMI standards. A single crystal semiconductor layer provided over a light-transmitting substrate can be determined by selecting a semiconductor substrate used as a material wafer.

Furthermore, the crystal plane of the single crystal semiconductor substrate 1108 may be selected depending on a semiconductor element to be manufactured (a field-effect transistor in this embodiment mode). For example, a single crystal semiconductor substrate having a {100} plane, a {110} plane, or the like can be used.

In this embodiment mode, an ion addition separation method is used in which ions of hydrogen, helium, or fluorine are added to a predetermined depth of the single crystal semiconductor substrate, and then heat treatment is performed to separate a single crystal semiconductor layer that is a surface layer. Another method may also be employed in which single crystal silicon is epitaxially grown on porous silicon and the porous silicon layer is separated by cleavage with water jetting A single crystal silicon substrate is used as the single crystal semiconductor substrate 1108. A surface of the single crystal semiconductor substrate 1108 is processed with dilute hydrofluoric acid to remove a native oxide film and contaminants such as dust attached to the surface, thereby being cleaned.

The embrittlement layer 1110 may be formed by adding (introducing) ions by an ion doping method (abbreviated as an ID method) or an ion implantation method (abbreviated as an II method). The embrittlement layer 1110 is formed by adding ions of hydrogen, helium, or halogen typified by fluorine. When fluorine ions are added as a halogen element, $BF_3$ may be used as a source gas. Note that ion implantation is a method in which an ionized gas is mass-separated and added to a semiconductor.

For example, an ionized hydrogen gas is mass-separated by an ion implantation method and only $H^+$ ions (or only $H_2^+$ ions) can be accelerated selectively and added.

In an ion doping method, without mass separation of an ionized gas, plural kinds of ion species are generated in plasma and accelerated, and then a single crystal semiconductor substrate is doped with the accelerated ion species. In the case where the single crystal semiconductor substrate is doped with hydrogen ions including $H^+$ ions, $H_2^+$ ions, and $H_3^+$ ions, the proportion of $H_3^+$ ions is typically 50% or more, for example, in general, the proportion of $H_3^+$ ions is 80% and the proportion of other ions ($H^+$ ions and $H_2^+$ ions) is 20%. Here, an ion doping also includes addition of only ion species of $H_3^+$ ions.

In addition, a single kind of ions or plural kinds of ions of the same atom that have different masses may be added. For example, when hydrogen ions are added, it is preferable to contain $H^+$ ions, $H_2^+$ ions, and $H_3^+$ ions and to have a high proportion of $H_3^+$ ions. In the case of adding hydrogen ions, when $H^+$ ions, $H_2^+$ ions, and $H_3^+$ ions are contained and the proportion of $H_3^+$ ions is high, addition efficiency can be increased and addition time can be shortened. With such a proportion, separation can be performed easily.

Hereinafter, an ion doping method and an ion implantation method will be described in detail. With the use of an ion doping apparatus (also referred to as an ID apparatus) used in an ion doping method, since the plasma space is large, a large amount of ions can be added to the single crystal semiconductor substrate. On the other hand, an ion implantation apparatus (also referred to as an II apparatus) used in an ion implantation method has a characteristic that ions extracted from plasma are mass-analyzed and only specific ion species can be implanted into a semiconductor substrate. In the ion implantation method, processing is usually performed by scanning with a point beam.

Both of the apparatuses generate a plasma state by thermoelectrons that are generated by heating of a filament. However, an ion doping method and an ion implantation method differ greatly in the proportion of the hydrogen ion species in adding (introducing) hydrogen ions ($H^+$, $H_2^+$, $H_3^+$), which are generated, to the semiconductor substrate.

In order to introduce a larger amount of $H_3^+$, the ion doping apparatus is preferable to the ion implantation apparatus.

When hydrogen ions or halogen ions such as fluorine ions are added to the single crystal silicon substrate, fluorine or the like that is added knocks out (expels) silicon atoms in a silicon crystal lattice, so that blank portions are created effectively and microvoids are made in the embrittlement layer. In this case, the volume change of the microvoids formed in the embrittlement layer occurs by heat treatment at a relatively low temperature, and a thin single crystal semiconductor layer can be formed by cleavage along the embrittlement layer. After the addition of fluorine ions, hydrogen ions may be added, so that hydrogen may be contained in the voids. Since the embrittlement layer that is formed to separate the thin single crystal semiconductor layer from the single crystal semiconductor substrate is cleaved using the volume change of the microvoids formed in the embrittlement layer, it is preferable to make effective use of fluorine ion action or hydrogen ion action in such a manner.

In addition, a protective layer may be formed between the single crystal semiconductor substrate and the insulating layer that is to be bonded to the single crystal semiconductor layer. The protective layer can be a single layer or stacked layers selected from a silicon nitride layer, a silicon oxide layer, a silicon nitride oxide layer, and a silicon oxynitride layer. These layers can be formed over the single crystal semiconductor substrate before the embrittlement layer is formed in the single crystal semiconductor substrate. Alternatively, these layers may be formed over the single crystal semiconductor substrate after the embrittlement layer is formed in the semiconductor substrate.

It is necessary to add ions under high dose conditions in the formation of the embrittlement layer, and the surface of the single crystal semiconductor substrate 1108 becomes rough in some cases. Therefore, a protective layer against the ion addition, such as a silicon nitride film, a silicon nitride oxide film, or a silicon oxide film may be provided to a thickness of 50 nm to 200 nm on the surface to which ions are added.

For example, as the protective layer, a silicon oxynitride film (5 nm to 300 nm in thickness, and preferably 30 nm to 150 nm (e.g., 50 nm) in thickness) and a silicon nitride oxide film (5 nm to 150 nm in thickness, and preferably 10 to 100 nm (e.g., 50 nm) in thickness) are stacked over the single crystal semiconductor substrate 1108 by plasma CVD. As an example, a silicon oxynitride film with a thickness of 50 nm is formed over the single crystal semiconductor substrate 1108, and a silicon nitride oxide film with a thickness of 50 nm is stacked over the silicon oxynitride film. The silicon oxynitride film may be a silicon oxide film formed by chemical vapor deposition using an organosilane gas.

Alternatively, the single crystal semiconductor substrate 1108 may be degreased and cleaned to remove an oxide film of the surface, and thermal oxidation may be performed. Although normal dry oxidation may be performed for thermal oxidation, it is preferable to perform oxidation in an oxidizing atmosphere to which halogen is added. For example, heat treatment is performed at a temperature of 700° C. or higher in an atmosphere that contains HCl at 0.5% to 10% by volume (preferably, 3% by volume) with respect to oxygen. Preferably, thermal oxidation is performed at a temperature of 950° C. to 1100° C. Processing time may be set to 0.1 to 6 hours, and preferably 0.5 to 3.5 hours. An oxide film to be formed has a thickness of 10 nm to 1000 nm (preferably, 50 nm to 200 nm), for example, 100 nm.

As a substance containing halogen, one or more selected from HF, $NF_3$, HBr, $Cl_2$, $ClF_3$, $BCl_3$, $F_2$, $Br_2$, and the like can be used instead of HCl.

When heat treatment is performed in such a temperature range, a gettering effect by a halogen element can be obtained. Gettering particularly has an effect of removing a metal impurity. That is, by the action of chlorine, impurities such as metal turn into a volatile chloride, and then are diffused into the air to be removed. The heat treatment has an advantageous effect on the surface of the single crystal semiconductor substrate 1108 that is subjected to chemical mechanical polishing (CMP) treatment. In addition, hydrogen has an effect of compensating a defect at the interface between the single crystal semiconductor substrate 1108 and the insulating layer so as to lower a localized-level density at the interface, whereby the interface between the single crystal semiconductor substrate 1108 and the insulating layer is inactivated to stabilize electric characteristics.

Halogen can be contained in the oxide film formed by this heat treatment. When a halogen element is contained at a concentration of $1\times10^{17}$ atoms/cm$^3$ to $5\times10^{20}$ atoms/cm$^3$, the oxide film can function as a protective layer that traps impurities such as metal and prevents contamination of the single crystal semiconductor substrate 1108.

When the embrittlement layer 1110 is formed, the accelerating voltage and the number of total ions can be adjusted by the thickness of a film stacked over the single crystal semiconductor substrate, the thickness of the targeted single crystal semiconductor layer that is separated from the single crystal semiconductor substrate and transferred to a light-transmitting substrate, and ion species to be added.

For example, the embrittlement layer can be formed by an ion doping method in such a manner that a hydrogen gas is used as a raw material, and ions are added at an accelerating voltage of 40 kV with a total ion number of $2\times10^{16}$ ions/cm$^2$. If the protective layer is increased in thickness, when the embrittlement layer is formed by adding ions under the same conditions, a thinner single crystal semiconductor layer can be formed as a target single crystal semiconductor layer that is separated from the single crystal semiconductor substrate and transferred (transposed) to the light-transmitting substrate. For example, although it depends on the proportion of ion species ($H^+$, $H_2^+$, and $H_3^+$ ions), in the case where the embrittlement layer is formed under the above conditions and a silicon oxynitride film (50 nm in thickness) and a silicon nitride oxide film (50 nm in thickness) are stacked as a protective layer over the single crystal semiconductor substrate, the thickness of the single crystal semiconductor layer to be transferred to the light-transmitting substrate is about 120 nm; and in the case where a silicon oxynitride film (100 nm in thickness) and a silicon nitride oxide film (50 nm in thickness) are stacked as a protective layer over the single crystal semiconductor substrate, the thickness of the single crystal semiconductor layer to be transferred to the light-transmitting substrate is about 70 nm.

When helium (He) or hydrogen is used as a source gas, the embrittlement layer can be formed by performing addition at an accelerating voltage in the range of 10 kV to 200 kV and a dosage in the range of $1\times10^{16}$ ions/cm$^2$ to $6\times10^{16}$ ions/cm$^2$. When helium is used as a source gas, $He^+$ ions can be added as main ions even when mass separation is not performed. In addition, when hydrogen is used as a source gas, $H_3^+$ ions and $H_2^+$ ions can be added as main ions. The ion species also change depending on the plasma generation method, pressure, the amount of source gas, or accelerating voltage.

As an example of forming the embrittlement layer, a silicon oxynitride film (50 nm in thickness), a silicon nitride oxide film (50 nm in thickness), and a silicon oxide film (50 nm in thickness) are stacked as a protective layer over the single crystal semiconductor substrate, and hydrogen is added at an accelerating voltage of 40 kV and a dosage of $2\times10^{16}$ ions/cm$^2$, whereby the embrittlement layer is formed in the single crystal semiconductor substrate. Then, a silicon oxide film (50 nm in thickness) is formed as an insulating layer having a bonded surface over the silicon oxide film that is the uppermost layer of the protective layer. As another example of forming the embrittlement layer, a silicon oxide film (100 nm in thickness) and a silicon nitride oxide film (50 nm in thickness) are stacked as a protective layer over the single crystal semiconductor substrate, and hydrogen is added at an accelerating voltage of 40 kV and a dosage of $2\times10^{16}$ ions/cm$^2$, whereby the embrittlement layer is formed in the single crystal semiconductor substrate. Then, a silicon oxide film (50 nm in thickness) is formed as an insulating layer having a bonded surface over the silicon nitride oxide film that is the uppermost layer of the protective layer. Note that the silicon oxynitride film and the silicon nitride oxide film may be formed by plasma CVD, and the silicon oxide film may be formed by CVD using an organosilane gas.

Furthermore, an insulating layer may be formed between the light-transmitting substrate and the single crystal semiconductor substrate. The insulating layer may be formed on one or both of the light-transmitting substrate side and the single crystal semiconductor substrate side. The insulating layer formed on a surface that forms a bond has a smooth surface and forms a hydrophilic surface. As the insulating layer, a silicon oxide film can be used. As the silicon oxide film, it is preferable to use a silicon oxide film formed by chemical vapor deposition using an organosilane gas. Besides, a silicon oxide film formed by chemical vapor deposition using a silane gas can also be used.

As the organosilane gas, the following silicon-containing compounds can be used: tetraethoxysilane (TEOS) (chemical formula: $Si(OC_2H_5)_4$), trimethylsilane (TMS: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), and the like. Note that in the case where a silicon oxide layer is formed by chemical vapor deposition using organosilane as a source gas, it is preferable to mix a gas containing oxygen. As a gas containing oxygen, oxygen, nitrous oxide, nitrogen dioxide, or the like can be used. Furthermore, an inert gas such as argon, helium, nitrogen, or hydrogen may be mixed.

Alternatively, as the insulating layer formed on a surface that forms a bond, it is possible to use a silicon oxide film formed by chemical vapor deposition using silane such as monosilane, disilane, or trisilane as a source gas. Also in this case, it is preferable to mix a gas containing oxygen, an inert gas, or the like. The silicon oxide film that is an insulating layer to be bonded to the single crystal semiconductor layer may contain chlorine. Note that in this specification, chemical vapor deposition (CVD) includes plasma CVD, thermal CVD, and photo CVD in its category.

Further alternatively, as the insulating layer formed on a surface that forms a bond, it is possible to use silicon oxide formed by heat treatment under an oxidizing atmosphere, silicon oxide grown by reaction of an oxygen radical, chemical oxide formed using an oxidizing chemical solution, or the like. As the insulating layer, an insulating layer including a siloxane (Si—O—Si) bond may also be used. Alternatively, the organosilane gas may be reacted with an oxygen radical or a nitrogen radical to form the insulating layer.

The surface of the insulating layer, which is to be bonded, preferably has an arithmetic mean roughness $R_a$ of less than 0.8 nm and a root-mean-square roughness $R_{ms}$ of less than 0.9 nm, more preferably, $R_a$, 0.4 nm or less and $R_{ms}$, 0.5 nm or less, and still more preferably, $R_a$, 0.3 nm or less and $R_{ms}$, 0.4 nm or less. For example, $R_a$ is 0.27 nm and $R_{ms}$ is 0.34 nm. In this specification, $R_a$ is arithmetic mean roughness, $R_{ms}$ is root-mean-square roughness, and the measurement range is 2 $\mu m^2$ or 10 $\mu m^2$.

When the light-transmitting substrate and the single crystal semiconductor substrate are bonded to each other, an insulating layer including a silicon oxide film that is deposited using organosilane as a raw material is preferably provided on one or both of the bonded surfaces, which leads to strong bonding.

Figure 15B:
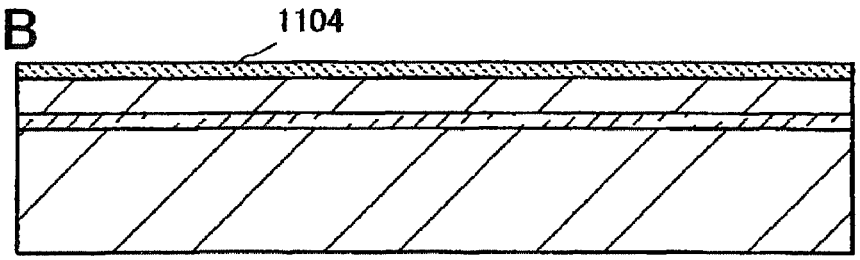

In this embodiment mode, as illustrated in FIG. 15B, a silicon oxide film is formed as an insulating layer 1104 on a surface bonded to the light-transmitting substrate. As the silicon oxide film, it is preferable to use a silicon oxide film formed by chemical vapor deposition using an organosilane gas. Besides, a silicon oxide film formed by chemical vapor deposition using a silane gas can also be used. The deposition by chemical vapor deposition is performed at a temperature of, for example, 350° C. or lower (specifically, 300° C. for example), which is the temperature at which the embrittlement layer 1110 formed in the single crystal semiconductor substrate is not degassed. Heat treatment for separating the single crystal semiconductor layer from the single crystal semiconductor substrate is performed at a temperature higher than the deposition temperature.

The light-transmitting substrate may be provided with a silicon nitride film or a silicon nitride oxide film as a blocking layer (also referred to as a barrier layer) for preventing diffusion of impurity elements. Furthermore, a silicon oxynitride film may also be provided in combination as an insulating film having a function of reducing stress.

Figure 15C:
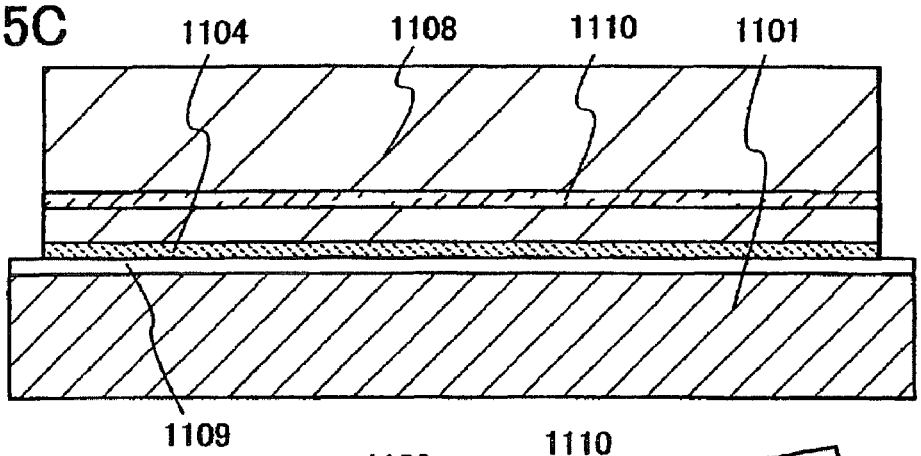

FIG. 15C illustrates a mode in which a blocking layer 1109 formed on a light-transmitting substrate 1101 is brought into close contact with and bonded to the surface of the single crystal semiconductor substrate 1108 on which the insulating layer 1104 is formed. The bonded surfaces are sufficiently cleaned. The blocking layer 1109 formed on the light-transmitting substrate 1101 and the surface of the single crystal semiconductor substrate 1108 on which the insulating layer 1104 is formed may be cleaned by megasonic cleaning or the like. In addition, the bonded surfaces may be cleaned with ozone water after megasonic cleaning, so as to remove organic substances and improve the hydrophilicity of the surfaces.

Then, the blocking layer 1109 on the light-transmitting substrate 1101 and the insulating layer 1104 are brought into close contact with each other to form a bond (also referred to as "to perform bonding"). The bond is formed by Van der Waals forces. When the light-transmitting substrate 1101 and the single crystal semiconductor substrate 1108 are pressed against each other, a stronger bond can be formed by hydrogen bonding.

The light-transmitting substrate 1101 and the single crystal semiconductor substrate 1108 may be pressed against each other while a pressure of 100 kPa to 5000 kPa is applied to one of the corners of the substrates. Accordingly, the bonded surfaces come close to each other, and bonding by Van der Waals forces can be changed to hydrogen bonding. When the bonded surfaces come close to each other at one point in the substrates, the bonded surfaces at the other points also come close to each other to change to hydrogen bonding; therefore, the entire bonded surfaces can be bonded by hydrogen bonding.

In order to form a favorable bond, the surfaces may be activated. For example, the bonded surfaces are irradiated with an atomic beam or an ion beam. In the case of utilizing an atomic beam or an ion beam, an inert gas neutral atom beam or inert gas ion beam of argon or the like can be used. Alternatively, plasma irradiation or radical treatment may be performed. Such surface treatment makes it easier to form a bond between different kinds of materials even at a temperature of 200° C. to 400° C.

Furthermore, heat treatment is preferably performed in order to increase the bonding strength of the interface between the light-transmitting substrate and the insulating layer. For example, heat treatment is performed in an oven, a furnace, or the like at a temperature of 70° C. to 350° C. (e.g., at 200° C. for 2 hours).

Figure 15D:
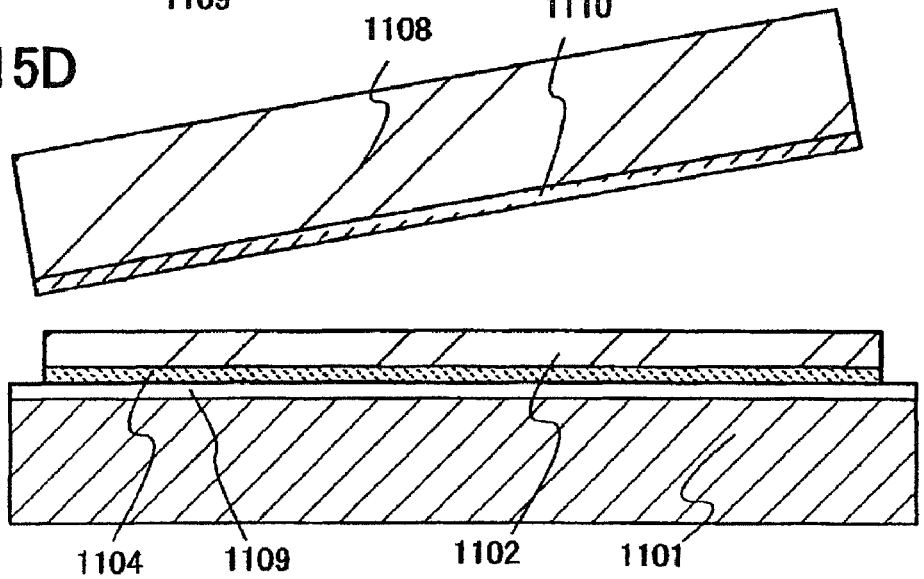

In FIG. 15D, after the light-transmitting substrate 1101 and the single crystal semiconductor substrate 1108 are bonded to each other, heat treatment is performed so that the single crystal semiconductor substrate 1108 is separated from the light-transmitting substrate 1101 using the embrittlement layer 1110 as a cleavage plane. For example, the volume change of microvoids formed in the embrittlement layer 1110 occurs by heat treatment at 400° C. to 700° C., which allows cleavage along the embrittlement layer 1110. Since the insulating layer 1104 is bonded to the light-transmitting substrate 1101 with the blocking layer 1109 interposed therebetween, a single crystal semiconductor layer 1102 having the same crystallinity as the single crystal semiconductor substrate 1108 remains over the light-transmitting substrate 1101.

The heat treatment in the temperature range of 400° C. to 700° C. may be performed sequentially using the same apparatus as used in the aforementioned heat treatment for increasing the bonding strength, or may be performed using another apparatus. For example, after heat treatment is performed in a furnace at 200° C. for 2 hours, the temperature is raised to around 600° C. and held for 2 hours, the temperature is lowered to the temperature range of room temperature to 400° C., and then the substrate is taken out of the furnace. Alternatively, the heat treatment temperature may be raised from room temperature. Further alternatively, after heat treatment is performed in a furnace at 200° C. for 2 hours, heat treatment may be performed using a rapid thermal annealing (RTA) apparatus at the temperature range of 600° C. to 700° C. for 1 minute to 30 minutes (e.g., at 600° C. for 7 minutes, or at 650° C. for 7 minutes).

By the heat treatment in the temperature range of 400° C. to 700° C., bonding between the insulating layer and the light-transmitting substrate changes from hydrogen bonding to covalent bonding, and an element added to the embrittlement layer is separated out to increase the pressure, whereby the single crystalline semiconductor layer can be separated from the single crystal semiconductor substrate. After the heat treatment, the light-transmitting substrate and the single crystal semiconductor substrate are in a state where one of them is placed over the other. Thus, the light-transmitting substrate and the single crystal semiconductor substrate can be separated from each other without strong force. For example, the substrates can be easily separated from each other by lifting one of the substrates placed upward with a vacuum chuck. In that case, the other of the substrates placed downward may be fixed with a vacuum chuck or a mechanical chuck, so that the light-transmitting substrate and the single crystal semiconductor substrate can be separated from each other without causing horizontal misalignment.

Note that FIGS. 15A to 15D and FIGS. 16A to 16C illustrate an example in which the size of the single crystal semiconductor substrate 1108 is smaller than that of the light-transmitting substrate 1101. However, the present invention is not limited, to this example, and the single crystal semiconductor substrate 1108 and the light-transmitting substrate 1101 may have the same size, or the size of the single crystal semiconductor substrate 1108 may be larger than that of the light-transmitting substrate 1101.

Figure 16A:
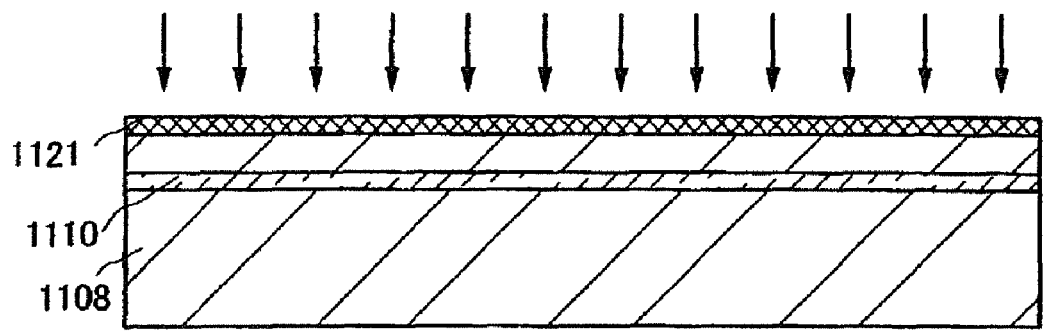
FIGS. 16A to 16C are diagrams illustrating a method of manufacturing a semiconductor device of the present invention.
Figure 16B:
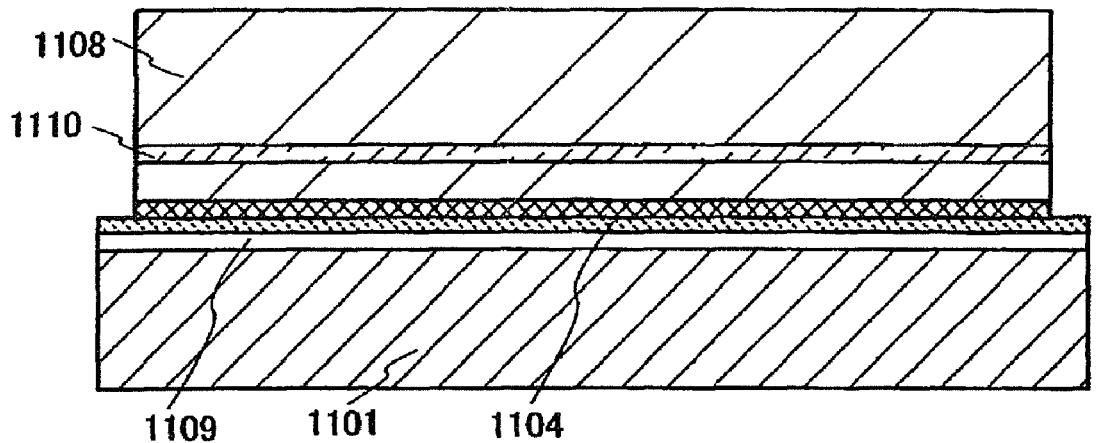
Figure 16C:
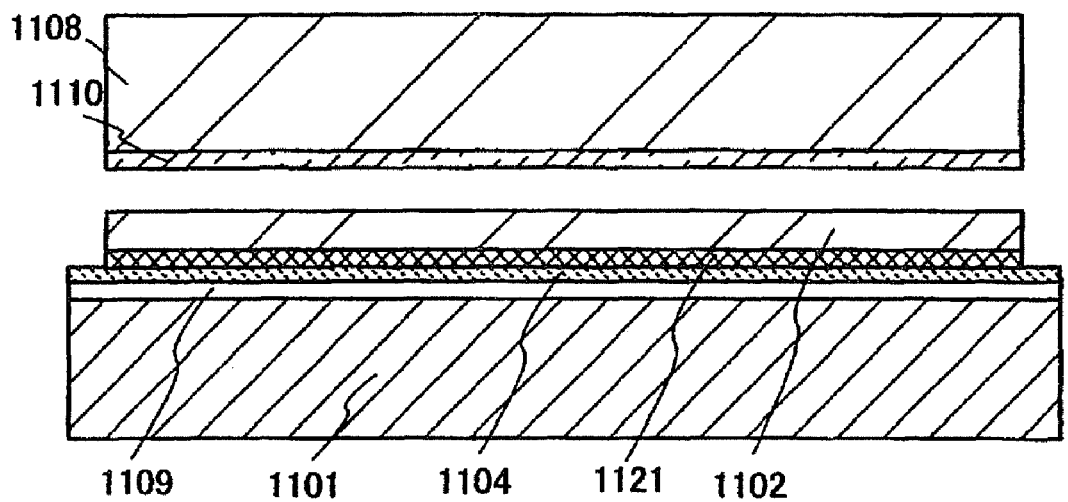

FIGS. 16A to 16C illustrate the steps of providing an insulating layer on the light-transmitting substrate side and forming a single crystal semiconductor layer. In FIG. 16A, ions accelerated by an electric field are added to a predetermined depth of the single crystal semiconductor substrate 1108 over which a silicon oxide film is formed as a protective layer 1121, whereby the embrittlement layer 1110 is formed. Ion addition is performed in a manner similar to that in the case of FIG. 15A. The protective layer 1121 formed over the surface of the single crystal semiconductor substrate 1108 prevents the surface from being damaged by ion addition and its planarity from being decreased. In addition, the protective layer 1121 has an advantageous effect of preventing diffusion of impurities into the single crystal semiconductor layer 1102 that is formed using the single crystal semiconductor substrate 1108.

In FIG. 16B, the light-transmitting substrate 1101 provided with the blocking layer 1109 and the insulating layer 1104 is brought into close contact with the surface of the single crystal semiconductor substrate 1108 on which the protective layer 1121 is formed, whereby a bond is formed. The insulating layer 1104 over the light-transmitting substrate 1101 and the protective layer 1121 on the single crystal semiconductor substrate 1108 are brought into close contact with each other, so as to form a bond.

Then, the single crystal semiconductor substrate 1108 is separated as illustrated in FIG. 16C. Heat treatment for separating the single crystal semiconductor layer is performed in a manner similar to that in the case of FIG. 15D. Thus, a semiconductor substrate having an SOI structure in which the single crystal semiconductor layer is formed over the substrate with the insulating layer interposed therebetween can be obtained as illustrated in FIG. 16C.

The single crystal semiconductor layer that is separated from the single crystal semiconductor substrate and transferred to the light-transmitting substrate may have crystal defects due to the separation step and the ion irradiation step, and the planarity of the surface thereof may be decreased and projections and depressions are formed. In the case where a transistor is manufactured as a semiconductor element by using the single crystal semiconductor layer, it is difficult to form a thin gate insulating layer with a high withstand voltage on the surface of such a single crystal semiconductor layer having projections and depressions. In addition, crystal defects in the single crystal semiconductor layer adversely affect the performance and reliability of the transistor; for example, the local interface state density with the gate insulating layer increases.

Therefore, it is preferable that the single crystal semiconductor layer be irradiated with electromagnetic waves such as laser light to reduce crystal defects. By irradiation with electromagnetic waves, at least part of the single crystal semiconductor layer can be melted to reduce crystal defects in the single crystal semiconductor layer. Note that before irradiation with electromagnetic waves, an oxide film (a native oxide film or a chemical oxide film) formed on the surface of the single crystal semiconductor layer may be removed with dilute hydrofluoric acid.

Any electromagnetic wave may be used as long as the single crystal semiconductor layer is provided with high energy, and preferably, laser light is used.

The energy can also be supplied mainly by heat conduction caused by making particles having high energy collide with the single crystal semiconductor layer by irradiation or the like. As a heat source for supplying particles having high energy, plasma can be used, and normal-pressure plasma, high-pressure plasma, a thermal plasma jet, or a flame of a gas burner or the like can be used. As another beat source, an electron beam or the like can be used.

The electromagnetic waves have such a wavelength as to be absorbed by the single crystal semiconductor layer. The wavelength can be determined in consideration of the skin depth of the electromagnetic waves, or the like. For example, the electromagnetic waves can have a wavelength of 190 nm to 600 nm. In addition, the energy of the electromagnetic waves can be determined in consideration of the wavelength of the electromagnetic waves, the skin depth of the electromagnetic waves, the thickness of the single crystal semiconductor layer to be irradiated with the electromagnetic waves, or the like.

As a laser emitting laser light, a continuous-wave laser, a pseudo continuous-wave laser, or a pulsed laser can be used. A pulsed laser is preferably used for partial melting. For example, an excimer laser such as a KrF laser, or a gas laser such as an Ar laser or a Kr laser can be used. Besides, it is possible to use a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser. Note that an excimer laser is a pulsed laser, and some solid-state lasers such as a YAG laser can be used as a continuous-wave laser, a pseudo continuous-wave laser, or a pulsed laser. When the solid-state laser is used, the second to fifth harmonics of a fundamental wave are preferably used. Alternatively, a semiconductor laser such as GaN, GaAs, GaAlAs, or InGaAsP can also be used.

Lamp light may be used as long as the single crystal semiconductor layer can be irradiated with the energy of electromagnetic waves. For example, it is possible to use light emitted from an ultraviolet lamp, a black light, a halogen lamp, a metal halide lamp, a xenon arc lamp, a carbon arc lamp, a high-pressure sodium lamp, or a high-pressure mercury lamp. A flash annealing process may be performed using the above lamp light. Since the flash annealing process preferably performed using a halogen lamp, a xenon lamp, or the like requires only a very short time, increase in temperature of the light-transmitting substrate can be suppressed.

A shutter, a reflector such as a mirror or a half mirror, or an optical system including a cylindrical lens, a convex lens, and the like may be provided to adjust the shape or path of electromagnetic waves.

Note that electromagnetic waves may be emitted selectively, or scanning with light (electromagnetic waves) may be performed in the X-Y directions to be emitted. In this case, a polygon mirror or a galvanometer mirror is preferably used in the optical system.

Irradiation with electromagnetic waves can be performed in an atmosphere containing oxygen such as an atmospheric air, or in an inert atmosphere such as a nitrogen atmosphere. To perform irradiation with electromagnetic waves in an inert atmosphere, electromagnetic waves may be emitted in an airtight chamber while controlling the atmosphere in this chamber. In the case where a chamber is not used, a nitrogen atmosphere can be formed by spraying an inert gas such as nitrogen gas on a surface to be irradiated with electromagnetic waves.

Furthermore, polishing treatment may be performed on the surface of the single crystal semiconductor layer, which is provided with high energy such as electromagnetic waves to reduce crystal defects. The planarity of the surface of the single crystal semiconductor layer can be improved by the polishing treatment.

As the polishing treatment, chemical mechanical polishing (CMP) or liquid jet polishing can be performed. Note that the surface of the single crystal semiconductor layer is cleaned to be purified before the polishing treatment. The cleaning may be performed by megasonic cleaning, two-fluid jet cleaning, or the like, and dust or the like on the surface of the single crystal semiconductor layer is removed by the cleaning. In addition, it is preferable that a native oxide film or the like on the surface of the single crystal semiconductor layer be removed with dilute hydrofluoric acid to expose the single crystal semiconductor layer.

In addition, polishing treatment (or etching treatment) may also be performed on the surface of the single crystal semiconductor layer before irradiation with electromagnetic waves.

Furthermore, when a single crystal semiconductor layer is transferred from the single crystal semiconductor substrate, the single crystal semiconductor substrate may be selectively etched to process of the shape so that a plurality of single crystal semiconductor layers are transferred to the light-transmitting substrate. In this case, a plurality of island-like single crystal semiconductor layers can be provided over the light-transmitting substrate. Since the shape of the single crystal semiconductor substrate is processed in advance and then the single crystal semiconductor layers are transferred, there is no limitation on the size and shape of the single crystal semiconductor substrate. Accordingly, the single crystal semiconductor layers can be transferred to a large light-transmitting substrate more efficiently.

Alternatively, a single crystal semiconductor layer bonded to the light-transmitting substrate may be etched so that the shape of the single crystal semiconductor layer is processed, modified, and controlled precisely. As a result, the single crystal semiconductor layer can be processed into shapes of single crystal semiconductor layers of a semiconductor element. It is thus possible to correct errors in the position and shape of the single crystal semiconductor layers, which are caused by pattern misalignment due to light exposure going around a resist mask in the formation of the resist mask, positional misalignment due to a bonding step in the transferring process, or the like.

Therefore, a plurality of single crystal semiconductor layers each having a desired shape can be formed over the light-transmitting substrate at a high yield. Thus, a semiconductor device including more accurate and higher performance semiconductor element and integrated circuit can be manufactured over a large substrate with high throughput and high productivity.

Alternatively, a single crystal semiconductor layer may be separated from the single crystal semiconductor substrate before being bonded to the light-transmitting substrate. The single crystal semiconductor layer may be bonded to the light-transmitting substrate so that a surface of the single crystal semiconductor layer that is exposed by cleavage faces the light-transmitting substrate or is in contact with a gate insulating film.

In this embodiment mode, when a single crystal silicon substrate is used as the single crystal semiconductor substrate 1108, a single crystal silicon layer can be obtained as the single crystal semiconductor layer 1102. In addition, the method of manufacturing a semiconductor device of this embodiment mode can be performed at a process temperature of 700° C. or lower; thus, a glass substrate can be used as the light-transmitting substrate 1101. That is, a transistor can be formed over a glass substrate similarly to a conventional thin film transistor, and further a single crystal silicon layer can be used as a semiconductor layer. Accordingly, a high-performance and high-reliability transistor, which is capable of high-speed operation and has a low subthreshold value, a high field-effect mobility, and low power consumption, can be manufactured over the light-transmitting substrate such as a glass substrate.

This embodiment Mode can be combined with Embodiment Mode 1 as appropriate.

Embodiment Mode 3

Described in this embodiment mode is an example of the process of bonding a single crystal semiconductor layer from a single crystal semiconductor substrate to a light-transmitting substrate, which is different from that described in Embodiment Mode 2. Therefore, description of the same portions or portions having a function similar to those described in Embodiment Mode 2 is omitted.

First, the processing of a single crystal substrate will be described. In this embodiment mode, a single crystal semiconductor substrate is degreased and cleaned to remove an oxide film of the surface, and then thermal oxidation is performed. As the thermal oxidation, it is preferable to perform oxidation in an oxidizing atmosphere to which halogen is added. For example, heat treatment is performed at a temperature of 700° C. or higher in an atmosphere that contains HCl at 0.5% to 10% by volume (preferably, 3% by volume) with respect to oxygen. Preferably, thermal oxidation is performed at a temperature of 950° C. to 1100° C. Processing time may be set to 0.1 to 6 hours, and preferably 0.5 to 3.5 hours. An oxide film to be formed has a thickness of 10 nm to 1000 nm (preferably, 50 nm to 200 nm), for example, 100 nm.

As a substance containing halogen, one or more selected from HF, $NF_3$, HBr, $Cl_2$, $ClF_3$, $BCl_3$, $F_2$, $Br_2$, and the like can be used instead of HCl.

When heat treatment is performed in such a temperature range, a gettering effect by a halogen element can be obtained. Gettering particularly has an effect of removing a metal impurity. That is, by the action of chlorine, impurities such as metal turn into a volatile chloride, and then are diffused into the air to be removed. It has an advantageous effect on the surface of the single crystal semiconductor substrate that is subjected to chemical mechanical polishing (CMP) treatment. In addition, hydrogen has an effect of compensating a defect at the interface between the single crystal semiconductor substrate and an insulating layer formed over a light-transmitting substrate, so as to lower a localized-level density at the interface, whereby the interface between the single crystal semiconductor substrate and the insulating layer is inactivated to stabilize electric characteristics.

Halogen can be contained in the oxide film formed by this heat treatment. When a halogen element is contained at a concentration of $1\times10^{17}$/cm to $5\times10^{20}$/cm$^3$, the oxide film can function as a protective layer that traps impurities such as metal and prevents contamination of the single crystal semiconductor substrate.

Ions are introduced into the single crystal semiconductor substrate to form an embrittlement layer. The depth at which the embrittlement layer is formed can be adjusted by the acceleration energy and incidence angle of the introduced ions. The acceleration energy can be controlled by accelerating voltage, dosage, or the like.

A hydrogen gas, a rare gas, or the like can be used for introducing ions. In this embodiment mode, a hydrogen gas is preferably used. When ion doping is performed using a hydrogen gas, $H^+$ ions, $H_2^+$ ions, and $H_3^+$ ions are generated, and it is preferable that the proportion of $H_3^+$ ions be the highest among them. $H_3^+$ ions can be introduced with a higher efficiency than $H^+$ ions and $H_2^+$ ions, and introduction time can be shortened. In addition, cracks are easily generated in the embrittlement layer in a subsequent step.

Next, the processing of a light-transmitting substrate is described. First, a surface of the light-transmitting substrate is cleaned. The surface may be cleaned by ultrasonic cleaning using hydrochloric acid/hydrogen peroxide mixture (BPM), sulfuric acid/hydrogen peroxide mixture (SPM), ammonium hydroxide/hydrogen peroxide mixture (APM), dilute hydrofluoric acid (DHF), or the like. In this embodiment mode, ultrasonic cleaning is performed using hydrochloric acid/hydrogen peroxide mixture.

Then, the light-transmitting substrate that has been cleaned to remove impurities such as dust on the surface thereof is subjected to planarizing treatment by plasma treatment. In this embodiment mode, the plasma treatment is performed in a vacuum chamber in such a manner that an inert gas such as an argon (Ar) gas is used and bias voltage is applied to the light-transmitting substrate to be processed, whereby plasma is generated. In addition to an inert gas, an oxygen ($O_2$) gas and a nitrogen ($N_2$) gas may be introduced.

The light-transmitting substrate is set to be in the cathode direction, and positive ions of Ar in the plasma are accelerated to the cathode direction to collide with the light-transmitting substrate. By collision of the Ar positive ions, the surface of the light-transmitting substrate is sputter-etched. Accordingly, a projection on the surface of the light-transmitting substrate is etched, so that the surface of the light-transmitting substrate can be planarized. A reactive gas has an advantageous effect of repairing defects caused by sputter etching of the surface of the light-transmitting substrate.

Next, an insulating layer is formed over the light-transmitting substrate. In this embodiment mode, an oxide film containing aluminum oxide as its main component, which is an insulating layer except silicon-based insulating layers, is used. The oxide film containing aluminum oxide as its main component refers to an oxide film that contains at least 10 wt. % of aluminum oxide in the case where the oxide film contains 100 wt. % of total components. Besides, a film that contains aluminum oxide as its main component and contains one or both of magnesium oxide and strontium oxide may be used as the insulating layer. Furthermore, an aluminum oxide film containing nitrogen may also be used.

The insulating layer can be formed by sputtering. As a sputtering target, for example, metal including aluminum or metal oxide such as aluminum oxide can be used. Note that the target material may be selected as appropriate depending on a film to be formed.

In the case where metal is used as a target, the insulating layer is formed by sputtering (reactive sputtering) while introducing a reaction gas (such as oxygen). As the metal, in addition to aluminum, magnesium (Mg), an alloy containing aluminum and magnesium, an alloy containing aluminum and strontium (Sr), or an alloy containing aluminum, magnesium, and strontium can be used. In this case, sputtering may be performed using a direct current (DC) power supply or a radio frequency (RF) power supply.

In the case where a metal oxide is used as the target, the insulating layer is formed by sputtering (RF sputtering) using a radio frequency (RF) power supply. As the metal oxide, in addition to aluminum oxide, magnesium oxide, strontium oxide, an oxide containing aluminum and magnesium, an oxide containing aluminum and strontium, or an oxide containing aluminum, magnesium, and strontium can be used.

Alternatively, the insulating layer may be formed by bias sputtering, which allows both deposition of a film and planarization of a surface to be achieved.

The oxide film containing aluminum as its main component can prevent impurities contained in the light-transmitting substrate, such as mobile ions or moisture, from diffusing into a single crystal semiconductor film that is to be formed later over the light-transmitting substrate.

Then, the surface of the single crystal semiconductor substrate is made to face the surface of the light-transmitting substrate, whereby the single crystal semiconductor substrate and the insulating layer are bonded to each other. The single crystal semiconductor substrate is brought into close contact with the surface of the insulating layer, whereby a bond is formed.

Note that before the single crystal semiconductor substrate and the light-transmitting substrate are bonded to each other, the surface treatment is preferably performed on the insulating layer formed over the light-transmitting substrate.

Subsequently, similarly to Embodiment Mode 2, heat treatment is performed to carry out separation (cleavage) at the embrittlement layer, whereby a single crystal semiconductor layer can be provided over the light-transmitting substrate with an insulating layer interposed therebetween.

A semiconductor element layer can be formed using the single crystal semiconductor layer provided over the light-transmitting substrate.

Next, a process of repeatedly using a separated single crystal semiconductor substrate (treatment for reprocessing a semiconductor substrate) will be described.

First, a separated single crystal semiconductor substrate is taken out. In some cases, the edge of the single crystal semiconductor substrate is not sufficiently bonded to the light-transmitting substrate due to edge roll-off. Thus, the edge of the single crystal semiconductor substrate is not separated along the embrittlement layer in some cases, and the insulating layer or the like may remain.

A residue on the edge of the single crystal semiconductor substrate is removed. The residue can be removed by wet etching. Specifically, wet etching is performed using a mixture solution containing hydrofluoric acid, ammonium fluoride, and surfactant (e.g., product name: LAL500, manufactured by Stella Chemifa Corporation) as an etchant.

The embrittlement layer into which hydrogen ions are introduced can be removed by wet etching using an organic alkaline aqueous solution typified by tetramethylammonium hydroxide (TMAH). By performing such treatment, a step due to the residue on the edge of the single crystal semiconductor substrate is reduced.

Then, the single crystal semiconductor substrate is oxidized in a halogen atmosphere to form an oxide film, and after that, the oxide film is removed. As the halogen, hydrogen chloride (HCl) can be used. Accordingly, a gettering effect by a halogen element can be obtained. Gettering particularly has an effect of removing a metal impurity. That is, by the action of chlorine, impurities such as metal turn into a volatile chloride, and then are diffused into the air to be removed.

Next, the single crystal semiconductor substrate is subjected to CMP treatment as polishing treatment. Thus, the step on the edge of the single crystal semiconductor substrate can be removed so that the surface of the single crystal semiconductor substrate is planarized. After that, the obtained single crystal semiconductor substrate is reused as a base wafer.

As described in this embodiment mode, reduction in cost can be achieved by repeatedly using a single crystal semiconductor substrate through the reprocessing steps of the single crystal semiconductor substrate. In addition, even in the case of repeatedly using a single crystal semiconductor substrate, the surface of the single crystal semiconductor substrate can be planarized sufficiently through the reprocessing steps described in this embodiment mode. Therefore, the adhesion between the single crystal semiconductor substrate and the light-transmitting substrate can be improved to reduce defective bonding.

This embodiment mode can be combined with Embodiment Modes 1 and 2 as appropriate.

Embodiment Mode 4

In this embodiment mode, an example in which a semiconductor device is provided with a housing to control the incident direction of light will be described with reference to FIG. 7 and FIG. 8.

Figure 7:
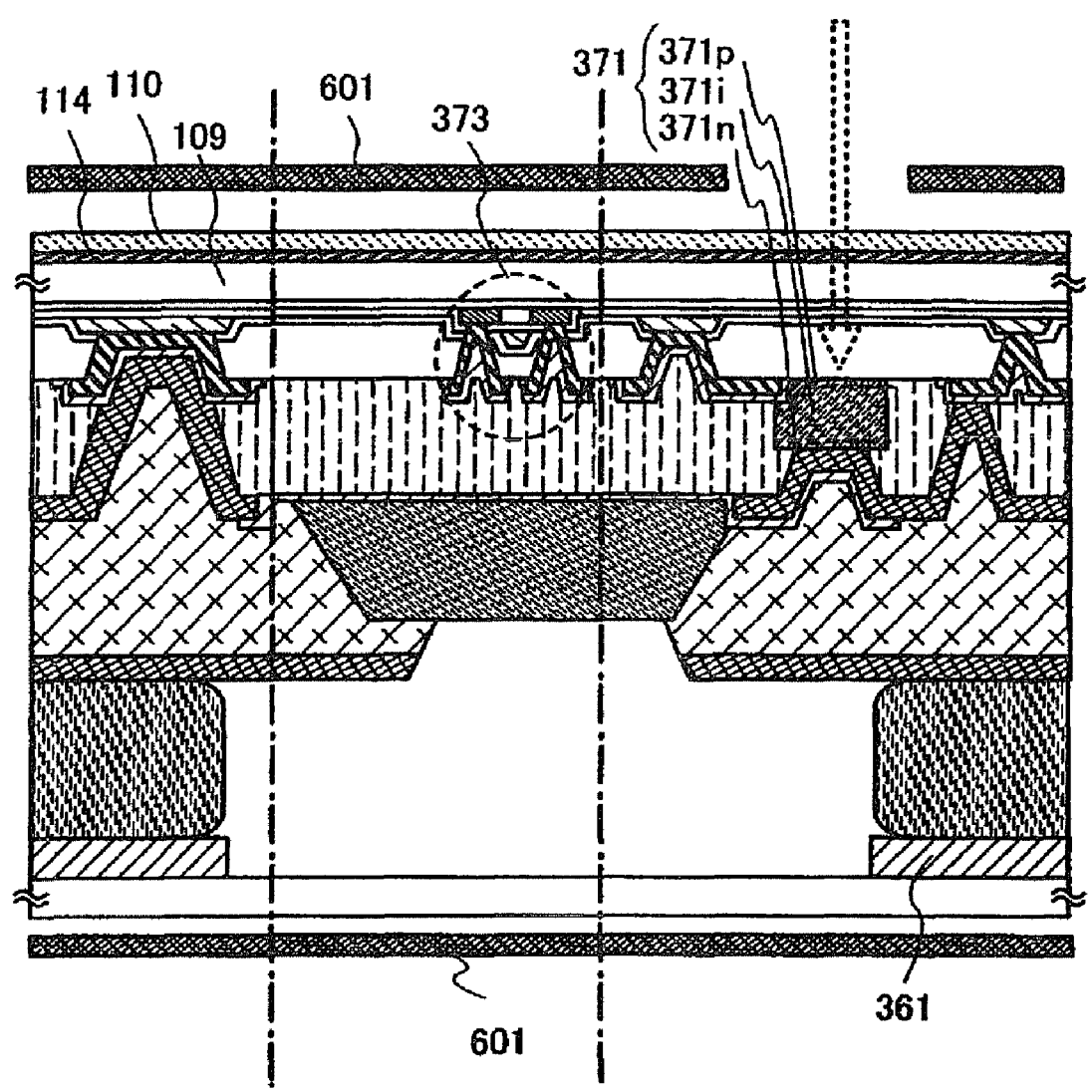
FIG. 7 is a diagram illustrating a semiconductor device of the present invention.

FIG. 7 illustrates an example in which the semiconductor device illustrated in FIG. 5B is provided with a housing 601 after the electrodes 361 and 362 on the substrate 360 are mounted on the terminal electrodes 115a and 115b by the solders 363 and 364, respectively, so that light enters the photoelectric conversion layer 371 from the light-transmitting substrate 109 side. The housing 601 includes an opening in a region where the photoelectric conversion layer 371 on the light-transmitting substrate 109 side is formed.

Light from the light-transmitting substrate 109 side is transmitted through the light-transmitting resin layers 114 and 110 and enters the photoelectric conversion layer 371 to generate photocurrent, thereby being detected.

The housing 601 may be formed of any material as long as it has a function of blocking light. For example, a metal material, a resin material including black pigment, or the like may be used.

Figure 8:
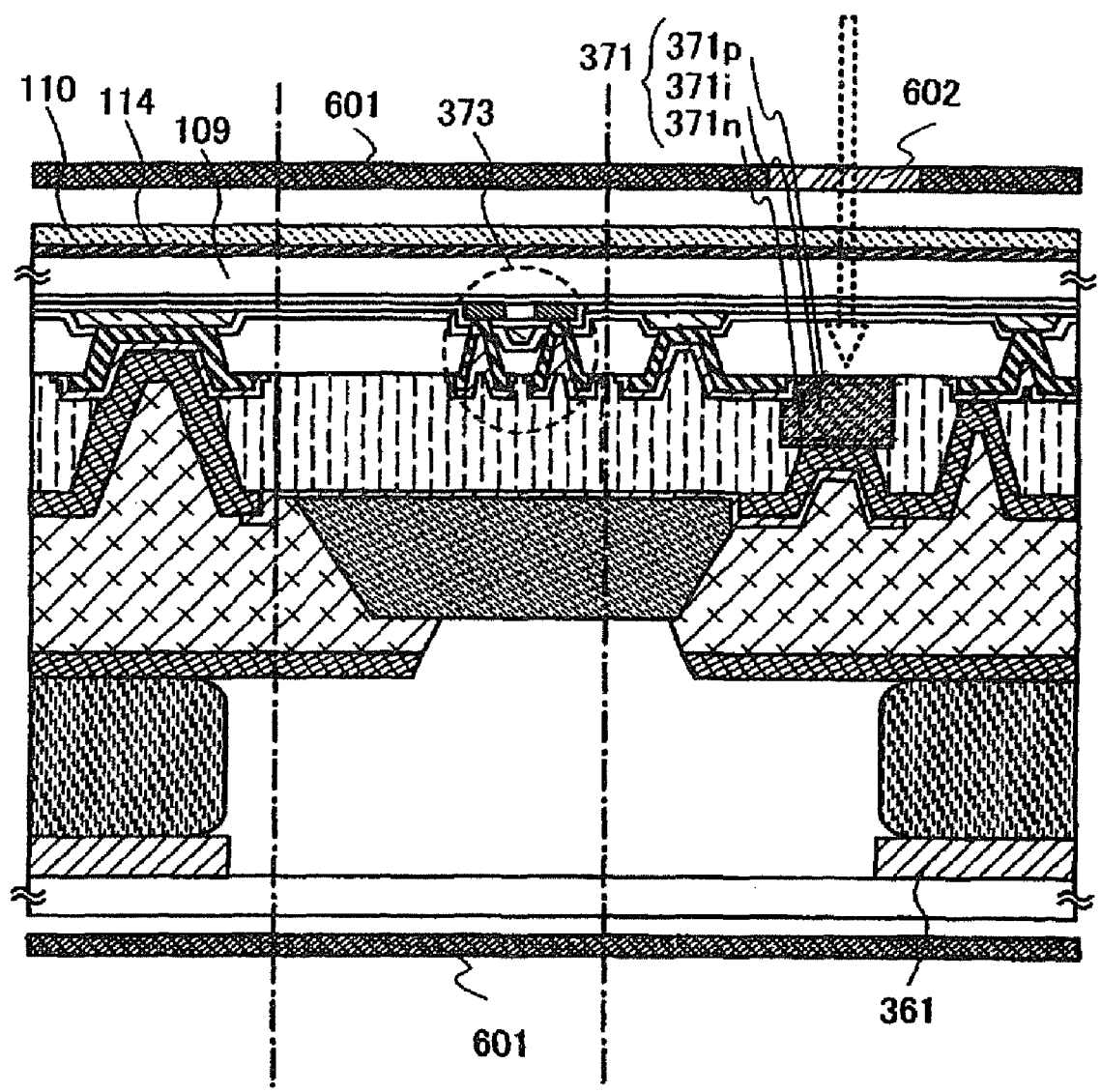
FIG. 8 is a diagram illustrating a semiconductor device of the present invention.

FIG. 8 illustrates an example in which the housing 601 is not provided with the opening, but is provided with a light-transmitting region 602 including a light-transmitting material.

Note that this embodiment mode can be implemented in appropriate combination with other embodiment modes of this specification.

Embodiment Mode 5

In this embodiment mode, examples of various electronic devices including a sensor that is obtained by the invention disclosed in this specification will be described. As electronic devices to which the invention disclosed in this specification is applied, there are computers, displays, cellular phones, television devices, and the like. Specific examples of such electronic devices are illustrated in FIGS. 10A to 10C, FIGS. 11A and 11B, FIG. 12, FIGS. 13A and 13B, and FIG. 14.

Figure 10A:
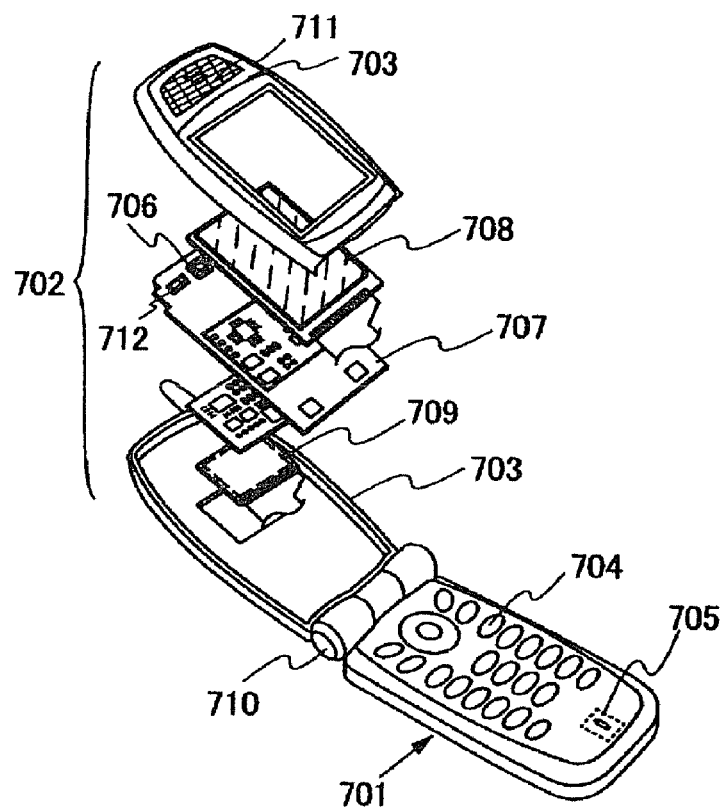
FIGS. 10A to 10C are views each illustrating a device on which a semiconductor device of the present invention is mounted.
Figure 10B:
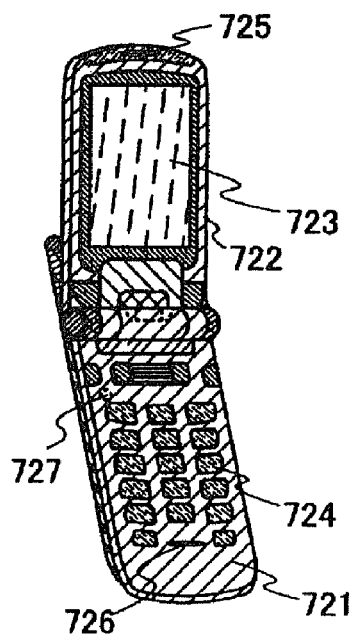
Figure 10C:
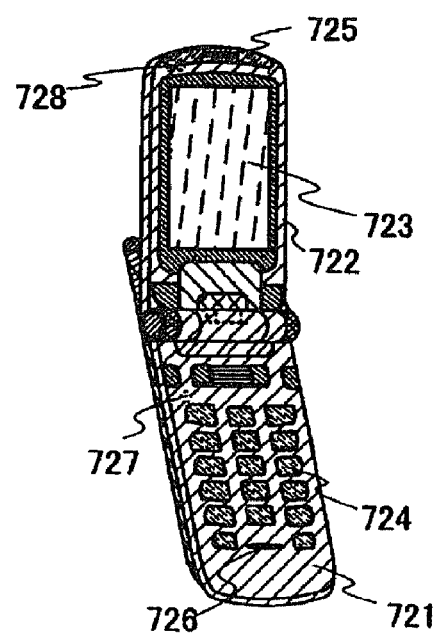

FIGS. 10A to 10C illustrate a cellular phone. FIG. 10A includes a main body (A) 701, a main body (B) 702, a housing 703, operation keys 704, a sound input portion 705, a sound output portion 706, a circuit board 707, a display panel (A) 708, a display panel (B) 709, a hinge 710, a light-transmitting material portion 711, and an optical sensor 712.

The optical sensor 712 detects light that is transmitted through the light-transmitting material portion 711, controls the luminance of the display panel (A) 708 and the display panel (B) 709 in accordance with the illuminance of the detected external light, and controls the illumination of the operation keys 704 in accordance with the illuminance obtained by the optical sensor 712. Accordingly, the current consumption of the cellular phone can be suppressed.

FIGS. 10B and 10C illustrate another example of a cellular phone. FIGS. 10B and 10C include a main body 721, a housing 722, a display panel 723, operation keys 724, a sound output portion 725, a sound input portion 726, an optical sensor 727, and an optical sensor 728.

In the cellular phone illustrated in FIG. 10B, the luminance of the display panel 723 and the operation keys 724 can be controlled by detecting external light by the optical sensor 727 provided in the main body 721.

In the cellular phone illustrated in FIG. 10C, an optical sensor 728 is provided inside the main body 721 in addition to the structure of FIG. 10A. The luminance of a backlight provided in the display panel 723 can also be detected by the optical sensor 728.

Figure 11A:
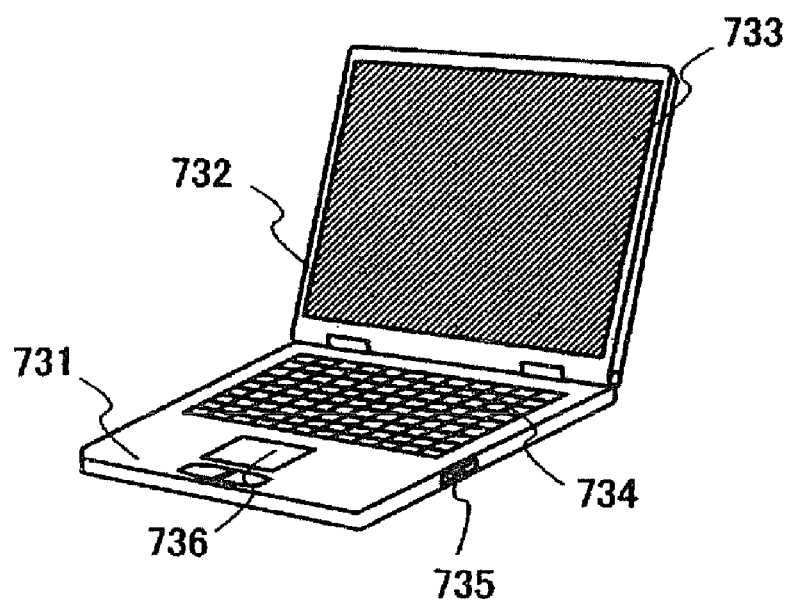
FIGS. 11A and 11B are views each illustrating a device on which a semiconductor device of the present invention is mounted.

FIG. 11A illustrates a computer including a main body 731, a housing 732, a display portion 733, a keyboard 734, an external connection port 735, a pointing device 736, and the like.

Figure 11B:
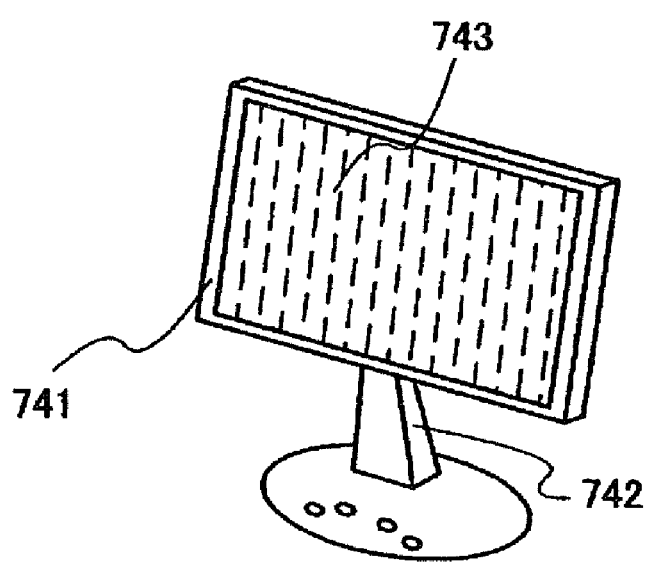

FIG. 11B illustrates a television device that is an example of a display device, which includes a housing 741, a supporting base 742, a display portion 743, and the like.

Figure 12:
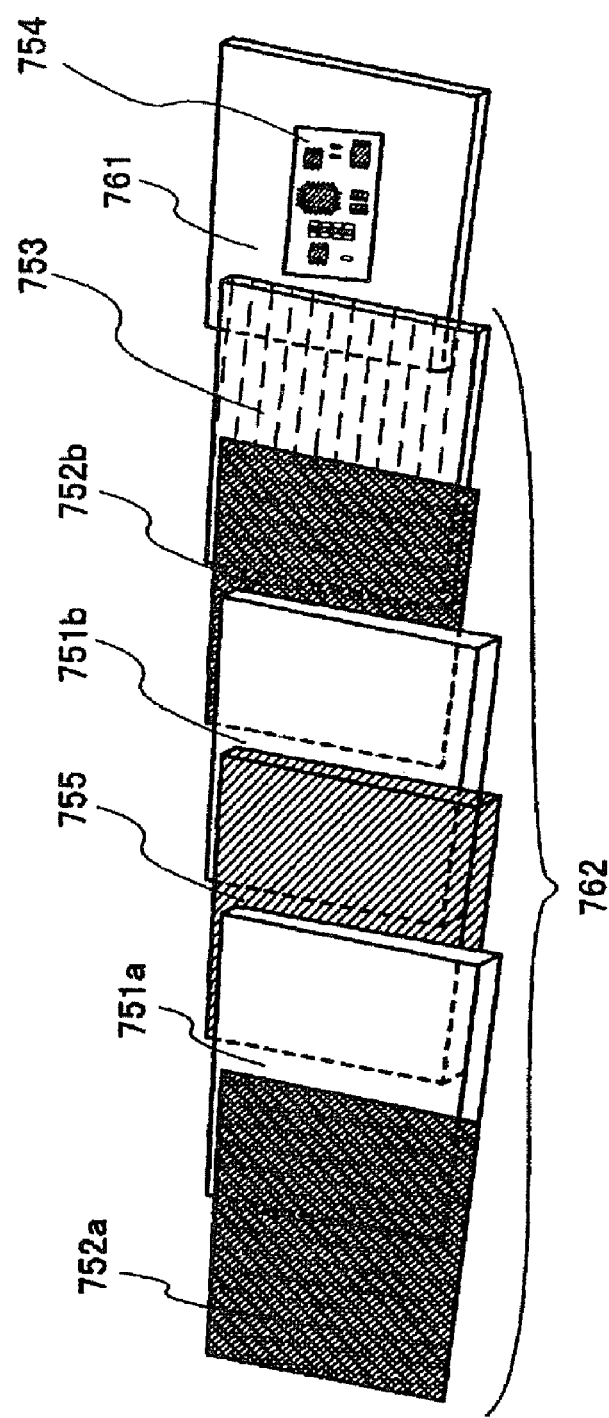
FIG. 12 is a view illustrating a device on which a semiconductor device of the present invention is mounted.

A structure in which a liquid crystal panel is used as the display portion 733 of the computer illustrated in FIG. 11A and the display portion 743 of the display device illustrated in FIG. 11B will be illustrated in detail in FIG. 12.

A liquid crystal panel 762 illustrated in FIG. 12 is incorporated in a housing 761 and includes a substrate 751a, a substrate 751b, a liquid crystal layer 755 sandwiched between the substrates 751a and 751b, a polarizing filter 752a, a polarizing filter 752b, a backlight 753, and the like. In addition, the housing 761 is provided with an optical sensor 754.

The amount of light from the backlight 753 is detected by the optical sensor 754 that is manufactured using the invention disclosed in this specification, and then the information thereof is fed back to control the luminance of the liquid crystal panel 762.

Figure 13A:
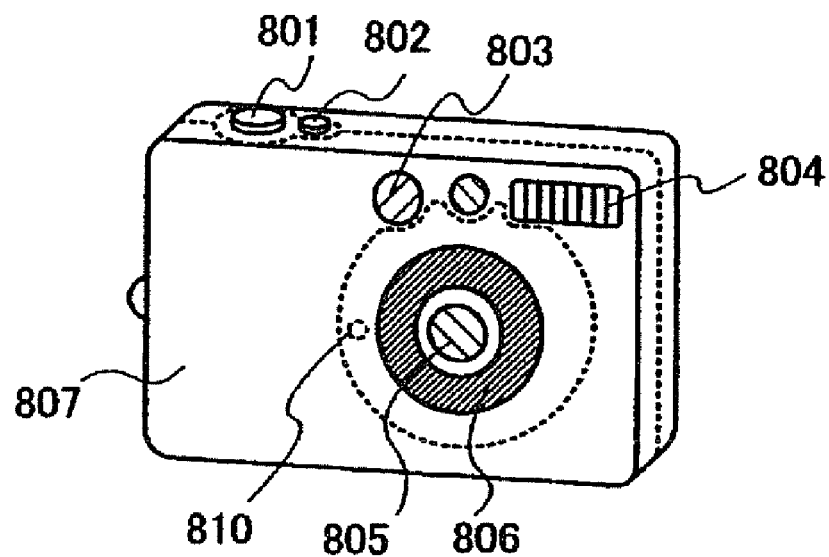
FIGS. 13A and 13B are views illustrating a device on which a semiconductor device of the present invention is mounted.
Figure 13B:
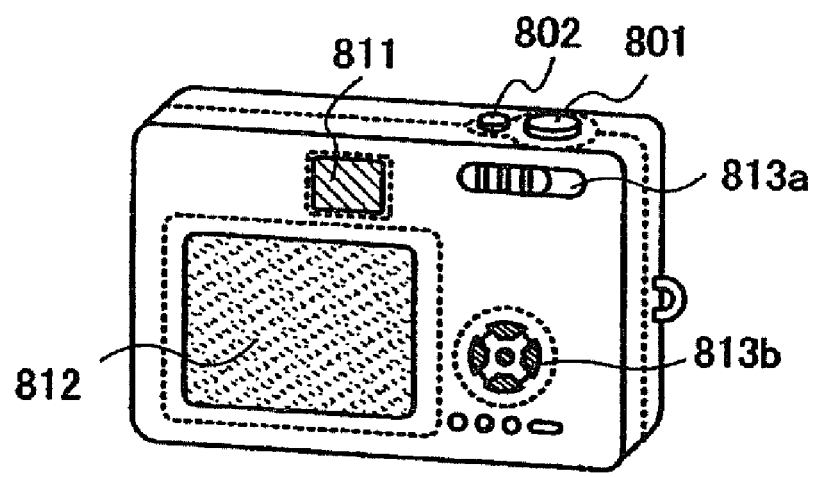

FIGS. 13A and 13B are views illustrating a camera, for example, a digital camera, which includes an optical sensor 810 using the invention disclosed in this specification. FIG. 13A is a perspective view from the front side of the digital camera, and FIG. 13B is a perspective view from the back side thereof. In FIG. 13A, the digital camera includes a release button 801, a main switch 802, a viewfinder 803, a flash 804, a lens 805, a lens barrel 806, a housing 807, and the optical sensor 810.

In FIG. 13B, the digital camera includes an eyepiece finder 811, a monitor 812, and operation buttons 813a and 813b.

When the release button 801 is pressed down halfway, a focus adjusting mechanism and an exposure adjusting mechanism are operated, and a shutter is opened when the release button 801 is fully pressed down.

When the main switch 820 is pressed or turned, the power of the digital camera is switched on or off.

The viewfinder 803 is located above the lens 805 on the front side of the digital camera, and used for checking the shooting range and the focus point from the eyepiece finder 811 illustrated in FIG. 13B.

The flash 804 is located in the upper portion of the front side of the digital camera. When the subject brightness is low, auxiliary light is emitted from the flash 804 at the same time as the release button is pressed down to open the shutter.

The lens 805 is located on the front of the digital camera. The lens 805 includes a focusing lens, a zoom lens, and the like, and forms a photographic optical system with a shutter and a diaphragm that are not illustrated. In addition, an image pickup device such as a CCD (charge coupled device) is provided behind the lens.

The lens barrel 806 moves the lens to focus the focusing lens, the zoom lens, and the like. In taking photographs, the lens barrel 806 is slid out to move the lens 805 forward. When carrying the digital camera, the lens 805 is moved backward to be compact. Note that the structure in which the object is zoomed in by sliding out the lens barrel is shown in this embodiment mode; however, the present invention is not limited to this structure. The digital camera may have another structure in which the object is zoomed in without sliding out the lens barrel by using the optical system inside the housing 807.

The eyepiece finder 811 is located in the upper portion of the back side of the digital camera. The shooting range and the focus point are checked by looking through the eyepiece finder 811.

The operation buttons 813 are located on the back side of the digital camera and have various functions, which include a set-up button, a menu button, a display button, a functional button, a selection button, and the like.

When the sensor 810 using the invention disclosed in this specification is incorporated in the camera illustrated in FIGS. 13A and 13B, the presence and intensity of light can be detected by the sensor 810 to adjust the exposure or the like of the camera. Since the sensor of the invention disclosed in this specification has a small thickness, the size of the device on which the sensor is mounted can also be reduced. Miniaturization of a component such as a sensor is particularly effective when the component is used for portable electronic devices.

Figure 14:
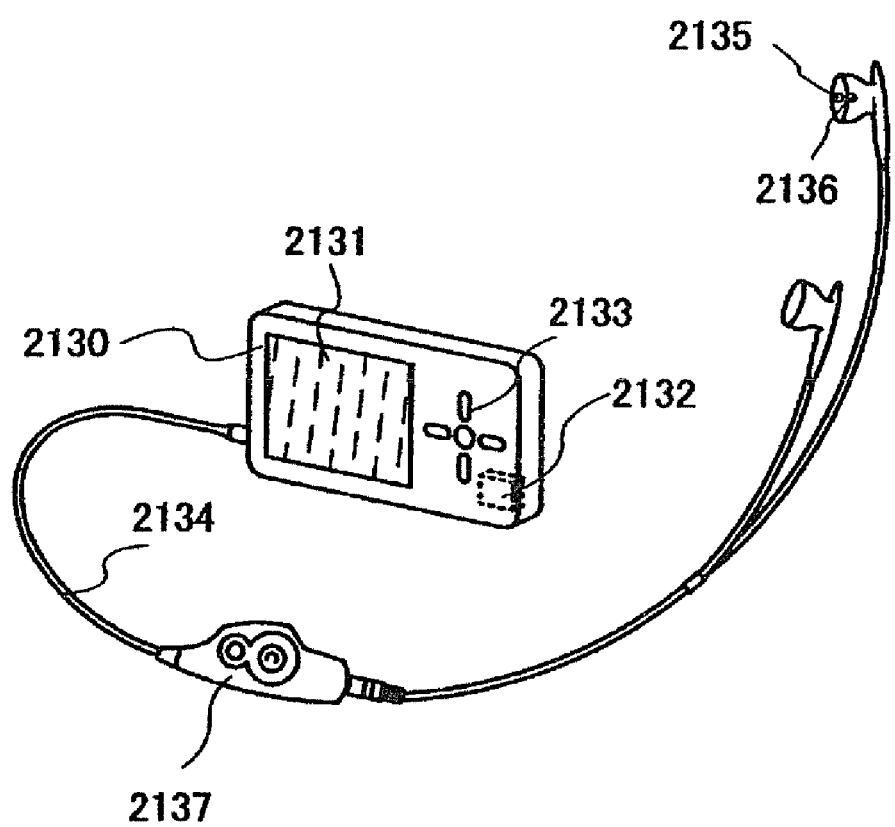
FIG. 14 is a view illustrating a device on which a semiconductor device of the present invention is mounted.

The invention disclosed in this specification can also be applied to portable information terminals having a sound reproducing function. FIG. 14 illustrates a digital player that is a typical example of an audio device. The digital player illustrated in FIG. 14 includes a main body 2130, a display portion 2131, a memory portion 2132, an operation portion 2133, earphones 2134, a sensor 2135, a sensor 2136, a control portion 2137, and the like. Note that headphones or wireless earphones may be used instead of the earphones 2134.

Since the sensor 2135 is an optical sensor for detecting light, it is provided in a region of the earphones, where light is blocked when the earphones are used. On the other hand, the sensor 2136 is a pressure-sensitive sensor, and thus is provided in a region of the earphones which is in contact with the ears when the earphones are used. The use or non-use of the earphones can be detected by detecting light in the sensor 2135 and detecting pressure in the sensor 2136. On the basis of the information detected by the sensor 2135 and the sensor 2136, the control portion 2137 controls the digital player so that the digital player is turned on when the earphones are used and turned off when the earphones are not used. Accordingly, without directly operating the operation portion 2133 of the main body 2130, the digital player can be automatically switched on or off in accordance with the use or non-use of the earphones.

Furthermore, images or sounds (music) can be recorded and reproduced by operating the operation portion 2133 with the use of the memory portion 2132. Note that the power consumption of the display portion 2131 can be suppressed by displaying white characters on the black background. Note that a removable memory may be provided in the memory portion 2132.

The semiconductor device disclosed in this specification can be applied to other electronic devices such as projection TVs and navigation systems. In other words, the semiconductor device disclosed in this specification can be applied to any device that needs to detect light.

Note that this embodiment mode can be implemented in appropriate combination with other embodiment modes of this specification.

This application is based on Japanese Patent Application serial No. 2008-011139 filed with Japan Patent Office on Jan. 22, 2008, the entire contents of which are hereby incorporated by reference.

EXPLANATION OF REFERENCE

100: light-transmitting substrate, 101 (110*a*, 101*b*, 101*c*): semiconductor element layer, 102: light-transmitting substrate, 103: fastening tape, 104: dicer, 105: light-transmitting substrate, 106*a*, 106*b*, 106*c*, 106*d*: grooves, 107: light-transmitting resin layer, 108: dicer, 109 (109*a*, 109*b*, 109*c*): light-transmitting substrate, 110 (110*a*, 110*b*, 110*c*): light-transmitting resin layer, 111: fastening tape, 112 (112*a*, 112*b*, 112*c*): semiconductor device, 113: light-transmitting resin layer, 114 (114*a*, 114*b*, 114*c*): light-transmitting resin layer, 115*a* (115*a*1, 115*a*2): terminal electrode, 115*b* (115*b*1, 115*b*2): terminal electrode, 115*c*1 and 115*c*2: terminal electrodes, 117: semiconductor device, 124: dicer, 125: light-transmitting substrate, 126*a*, 126*b*, 126*c* and 126*d*: grooves, 127: resin layer, 128: dicer, 129*a*, 129*b* and 129*c*: light-transmitting substrates, 130*a*, 130*b* and 130*c*: light-transmitting resin layers, 131: fastening tape, 132*a*, 132*b* and 132*c*: semiconductor devices, 133: light-transmitting resin layer, 134*a*, 134*b* and 134*c*: light transmitting resin layers, 151: element layer, 155: substrate, 156: pixel portion, 310: light-transmitting substrate, 312: base insulating film, 313: gate insulating film, 314: wiring, 316: interlayer insulating film, 317: interlayer insulating film, 318: protective electrode, 319: wiring, 320: connection electrode, 324: sealing layer, 331: semiconductor layer, 334: gate electrode, 337: drain region, 341: drain electrode, 345: protective electrode, 346: protective electrode, 348: protective electrode, 350: terminal electrode, 351: terminal electrode, 360: substrate, 361: electrode, 362: electrode, 371: photoelectric conversion layer, 371*i*: i-type semiconductor layer, 371*n*: n-type semiconductor layer, 371*p*: p-type semiconductor layer, 373: transistor, 374: wiring, 375: wiring, 377: protective film, 378: sealing film, 601: housing, 602: light-transmitting region, 701: main body (A), 702: main body (B), 703: housing, 704: operation keys, 705: sound input portion, 706: sound output portion, 707: circuit board, 708: display panel (A), 709: display panel (B), 710: hinge, 711: light-transmitting material portion, 712: optical sensor, 721: main body, 722: housing, 723: display panel, 724: operation keys, 725: sound output portion, 726:

sound input portion, 727: optical sensor, 728: optical sensor, 731: main body, 732: housing, 733: display portion, 734: keyboard, 735: external connection port, 736: pointing device, 741: housing, 742: supporting base, 743: display portion, 751a: substrate, 751b: substrate, 752a: polarizing filter, 752b: polarizing filter, 753: backlight, 754: optical sensor, 755: liquid crystal layer, 761: housing, 762: liquid crystal panel, 801: release button, 802: main switch, 803: viewfinder, 804: flash, 805: lens, 806: lens barrel, 807: housing, 810: sensor, 811: eyepiece finder, 812: monitor, 813 (813a, 813b): operation button, 1101: light-transmitting substrate, 1102: single crystal semiconductor layer, 1104: insulating layer, 1108: single crystal semiconductor substrate, 1109: blocking layer, 1110: embrittlement layer, 1121: protective layer, 2130: main body, 2131: display portion, 2132: memory portion, 2133: operation portion, 2134: earphones, 2135: sensor, 2136: sensor, 2137: control portion

What is claimed is:

1. A method of manufacturing a semiconductor device, comprising the steps of:
   forming a plurality of semiconductor element layers over a light-transmitting substrate;
   thinning the light-transmitting substrate;
   forming a groove in the light-transmitting substrate on a surface opposite the semiconductor element layers, wherein the groove is between the semiconductor element layers;
   forming a first light-transmitting resin layer over the light-transmitting substrate including the groove;
   forming a second light-transmitting resin layer over the first light-transmitting resin layer; and
   cutting the light-transmitting substrate, the first light-transmitting resin layer, and the second light-transmitting resin layer through the groove,
   wherein one of the first light-transmitting resin layer and the second light-transmitting resin layer includes a chromatic color material.

2. A method of manufacturing a semiconductor device, comprising the steps of:
   forming a plurality of semiconductor element layers over a light-transmitting substrate;
   thinning the light-transmitting substrate;
   forming a groove in the light-transmitting substrate on a surface opposite the semiconductor element layers, wherein the groove is between the semiconductor element layers;
   forming a first light-transmitting resin layer over the light-transmitting substrate including the groove;
   forming a second light-transmitting resin layer over the first light-transmitting resin layer; and
   cutting the light-transmitting substrate, the first light-transmitting resin layer, and the second light-transmitting resin layer from the groove of the light transmitting light-transmitting substrate,
   wherein one of the first light-transmitting resin layer and the second light-transmitting resin layer includes a chromatic color material.

3. The method of manufacturing a semiconductor device, according to claim 1 or 2, wherein the width of a cutting surface for cutting the groove of the light-transmitting substrate, the first light-transmitting resin layer, and the second light-transmitting resin layer is smaller than the width of the groove.

4. The method of manufacturing a semiconductor device, according to claim 1 or 2, wherein the groove is formed by using a dicer.

5. The method of manufacturing a semiconductor device, according to claim 1 or 2, further comprising the step of obtaining a plurality of semiconductor devices in the form of a chip after cutting the light-transmitting substrate, the first light-transmitting resin layer, and the second light-transmitting resin layer.

6. The method of manufacturing a semiconductor device, according to claim 1 or 2, wherein the semiconductor element layers include photoelectric conversion elements.

7. The method of manufacturing a semiconductor device, according to claim 1 or 2, wherein the first light-transmitting resin layer includes the chromatic color material.

* * * * *

UNITED STATES PATENT AND TRADEMARK OFFICE
CERTIFICATE OF CORRECTION

PATENT NO. : 8,324,079 B2
APPLICATION NO. : 12/355069
DATED : December 4, 2012
INVENTOR(S) : Hidekazu Takahashi et al.

It is certified that error appears in the above-identified patent and that said Letters Patent is hereby corrected as shown below:

In the Drawings:

At Sheet 1 of 17, please replace Figure 1B with the following corrected Figure 1B:

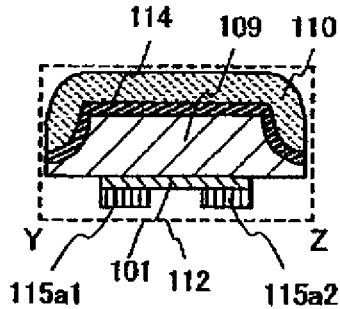

In the Specification:

At column 8, line 11, "111$a$" should be --101$a$--;

At column 12, line 60, "$SiC_4$" should be --$SiCl_4$--;

At column 13, line 67, "(fr)" should be --(Ir)--;

At column 16, line 54, "neodymium ed)" should be --neodymium (Nd)--;

At column 16, line 56, "iridium (r)" should be --iridium (Ir)--;

At column 30, line 23, "beat" should be --heat--;

At column 33, line 5, "/cm" should be --/cm$^3$--;

Signed and Sealed this
Sixteenth Day of April, 2013

Teresa Stanek Rea
*Acting Director of the United States Patent and Trademark Office*

At column 33, line 28, "(BPM)" should be --(HPM)--;

At column 37, line 61, "band" should be --hand--.